United States Patent
Yokokawa et al.

(10) Patent No.: US 6,765,507 B2
(45) Date of Patent: Jul. 20, 2004

(54) ENCODING DEVICE AND METHOD AND DECODING DEVICE AND METHOD

(75) Inventors: Takashi Yokokawa, Tokyo (JP); Masayuki Hattori, Kanagawa (JP); Toshiyuki Miyauchi, Tokyo (JP); Kohei Yamamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/428,905

(22) Filed: May 2, 2003

(65) Prior Publication Data

US 2004/0025102 A1 Feb. 5, 2004

(30) Foreign Application Priority Data

May 7, 2002 (JP) ..................................... P2002-131964

(51) Int. Cl.[7] .............................................. H03M 7/00
(52) U.S. Cl. ........................................ 341/50; 341/61
(58) Field of Search .............................. 341/50, 51, 59, 341/61

(56) References Cited

U.S. PATENT DOCUMENTS 5,537,112 A * 7/1996 Tsang ........................... 341/59
6,603,412 B2 * 8/2003 Gatherer et al. ............... 341/61

* cited by examiner

*Primary Examiner*—Brian Young
(74) *Attorney, Agent, or Firm*—Sonnenschein, Nath & Rosenthal LLP

(57) ABSTRACT

An encoding device in a data transmission/reception system includes a first convolutional encoder that encodes an outer code, an interleaver that permutes input data, a second convolutional encoder that encodes an inner code, and a muti-level modulation mapping circuit that performs signal-point mapping based on eight-phase shift keying. When the encoding device uses the second convolutional encoder having two or more memories, the first convolutional encoder uses, as the outer code, a code with a minimum output distance greater than the maximum input distance at which the minimum-distance inner code is generated.

52 Claims, 31 Drawing Sheets

ENCODING DEVICE AND METHOD AND DECODING DEVICE AND METHOD

RELATED APPLICATION DATA

The present application claims priority to Japanese Application(s) No(s). P2002-131964 filed May 7, 2002, which application(s) is/are incorporated herein by reference to the extent permitted by law.

BACKGROUND OF THE INVENTION

1. Field of the Invention

The present invention relates to encoding devices and methods for performing serially concatenated convolutional coding or serial concatenated trellis coded modulation and to decoding devices and methods for decoding codes generated by serially concatenated convolutional coding or serial concatenated trellis coded modulation performed by such encoding devices and methods.

2. Description of the Related Art

Nowadays, a considerable amount of research is being conducted in communications fields, such as mobile communications and deep space communications, and in broadcasting fields, such as terrestrial and satellite digital broadcasting. In relation to such research, coding theory research has been extensively conducted to improve the efficiency of error-correcting coding and decoding.

One known theoretical limit of code performance is the Shannon limit, which is given by Shannon's channel coding theorem.

The purpose of coding theory research is to develop codes that have near-Shannon-limit performance. Recently, for example, serially concatenated convolutional codes (hereinafter referred to as SCCC) have been developed by an encoding method that generates codes showing performance near the Shannon limit.

SCCC coding is performed by serially concatenating two convolutional encoders and an interleaver. SCCC decoding is performed by serially concatenating two soft-output decoder circuits, which exchange information with each other to obtain a final decoded result.

One known application of SCCC coding is serial concatenated trellis coded modulation (hereinafter referred to as SCTCM), which is described in D. Divsalar and F. Pollara, "Serial and Hybrid Concatenation Codes with Applications", in Proc. Int. Symp. on Turbo Codes and Related Topics, Brest, France, pp. 80–87, September 1997. SCTCM combines SCCC coding and multi-level modulation and takes into consideration the entirety of the signal constellation of modulated signals and the decoding characteristics of error-correcting codes.

Specific examples of an encoding device that performs SCTCM coding and a decoding device that performs decoding of a code in SCTCM will now be described. In the following description, as shown in FIG. 13, digital information is encoded by an encoding device 201 included in a transmitter (not shown). The output of the encoder 201 is input to a receiver (not shown) via a memoryless channel 202 and decoded by a decoding device 203 included in the receiver. The decoded information is then observed.

The encoding device 201 that performs SCTCM coding includes, for example, as shown in FIG. 14, a convolutional encoder 210 that encodes an outer code, an interleaver 220 that permutes input data, a convolutional encoder 230 that encodes an inner code, and a multi-level modulation mapping circuit 240 that performs signal point mapping based on a predetermined modulation system. The encoding device 201 performs a serially concatenated convolutional operation on 2-bit input data D201 with a code rate of 2/3 to convert the input data D201 into 3-bit encoded data D204, maps the encoded data D204 to a transmission symbol in, for example, eight-phase shift keying (hereinafter referred to as 8PSK), and outputs a resultant 3-bit encoded transmission symbol D205.

Referring to FIG. 15, the convolutional encoder 210 has three exclusive OR circuits 211, 213, and 215 and two shift registers 212 and 214.

The exclusive OR circuit 211 computes the exclusive OR of 2-bit input data $D201_1$ and $D202_2$ and supplies the computation result to the shift register 212.

The shift register 212 continuously supplies 1-bit data maintained therein to the exclusive OR circuit 213. In synchronization with a clock signal, the shift register 212 maintains new 1-bit data supplied from the exclusive OR circuit 211 and supplies the new data to the exclusive OR circuit 213.

The exclusive OR circuit 213 computes the exclusive OR of data supplied from the shift register 212 and the 1-bit input data $D201_1$ of the 2-bit input data D201 and supplies the computation result to the shift register 214.

The shift register 214 continuously supplies 1-bit data maintained therein to the exclusive OR circuit 215. In synchronization with a clock signal, the shift register 214 maintains new 1-bit data supplied from the exclusive OR circuit 213 and supplies the new data to the exclusive OR circuit 215.

The exclusive OR circuit 215 computes the exclusive OR of data supplied from the shift register 214 and the input data $D201_1$ and $D201_2$ and supplies the computation result serving as 1-bit encoded data $D202_3$ of 3-bit encoded data D202 to the interleaver 220 at a subsequent stage.

When the convolutional encoder 210 described above receives the 2-bit input data $D201_1$ and $D202_2$, the convolutional encoder 210 performs a convolutional operation of the input data $D201_1$ and $D202_2$ and outputs the operation result as 3-bit encoded data $D202_1$, $D202_2$, and $D202_3$ to the interleaver 220 at the subsequent stage. In other words, the convolutional encoder 210 performs a convolutional operation to encode the outer code with a code rate of 2/3 and outputs the generated encoded data D202 to the interleaver 220 at the subsequent stage.

The interleaver 220 interleaves the encoded data D202 consisting of a 3-bit sequence output from the convolutional encoder 210 and outputs interleaved data D203 consisting of the generated 3-bit sequence to the convolutional encoder 230 at a subsequent stage.

Referring to FIG. 16, the convolutional encoder 230 includes an exclusive OR circuit 231 and a shift register 232.

The exclusive OR circuit .231 computes the exclusive OR of 3-bit interleaved data $D203_1$, $D203_2$, and $D203_3$. The exclusive OR circuit 231 outputs the computation result serving as 1-bit encoded data $D204_3$ of 3-bit encoded data D204 to the multi-level modulation mapping circuit 240 at a subsequent stage and supplies the computation result to the shift register 232.

The shift register 232 continuously supplies 1-bit data maintained therein to the exclusive OR circuit 231. In synchronization with a clock signal, the shift register 232 maintains new 1-bit data supplied from the exclusive OR circuit 231 and supplies the new data to the exclusive OR circuit 231.

When the convolutional encoder 230 described above receives the 3-bit interleaved data $D203_1$, $D203_2$, and $D203_3$, the convolutional encoder 210 performs a convolutional operation of the interleaved data $D203_1$, $D203_2$, and $D203_3$ and outputs the operation result as 3-bit encoded data $D204_1$, $D204_2$, and $D204_3$ to the multi-level modulation mapping circuit 240 at the subsequent stage. In other words, the convolutional encoder 230 performs a convolutional operation to encode the inner code with a code rate of 3/3=1 and outputs the generated encoded data D204 to the multi-level modulation mapping circuit 240 at the subsequent stage.

In synchronization with a clock signal, the multi-level modulation mapping circuit 240 maps the encoded data D204 output from the convolutional encoder 230 to, for example, an 8PSK transmission symbol. Specifically, the multi-level modulation mapping circuit 240 maps the 3-bit encoded data D204 output from the convolutional encoder 230 as a single transmission symbol and generates a single encoded transmission symbol D205. The multi-level modulation mapping circuit 240 outputs the generated encoded transmission symbol D205 to the outside.

In the encoding device 201 described above, the convolutional encoder 210 performs a convolutional operation to encode the outer code with a code rate of 2/3 and the convolutional encoder 230 performs a convolutional operation to encode the inner code with a code rate of 1, resulting in performing a serially concatenated convolutional operation with an overall code rate of (2/3)×1=2/3. The data encoded and modulated by the encoding device 201 is output to the receiver via the memoryless channel 202.

In contrast, the decoding device 203 that decodes a code in SCTCM generated by the encoding device 201 includes, for example, as shown in FIG. 17, a soft-output decoder circuit 250 that decodes the inner code, a de-interleaver 260 that rearranges the order of input data to the original order, and a soft-output decoder circuit 280 that decodes the outer code. The decoding device 203 estimates the input data D201 of the encoding device 201 from a received value D206, which is an analog value due to the effects of noise generated on the memoryless channel 202 and which serves as soft-input, and outputs the estimated data as decoded data D211.

The soft-output decoder circuit 250 is associated with the convolutional encoder 230 of the encoding device 201. The soft-output decoder circuit 250 performs maximum a-posteriori probability (hereinafter referred to as MAP) decoding based on the BCJR algorithm described in Bahl, Cocke, Jelinek, and Raviv, "Optimal Decoding of Linear Codes for Minimizing Symbol Error Rate", IEEE Trans. Info. Theory, Vol. IT-20, pp. 284–287, March 1974 or based on the Max-Log-MAP algorithm or the Log-MAP algorithm that is an improvement of the BCJR algorithm and that is described in Robertson, Villebrun, and Hoeher, "A Comparison of Optimal and Sub-Optimal MAP Decoding Algorithms Operating in the Log Domain", IEEE Int. Conf. on Communications, pp. 1009–1013, June 1995 (hereinafter referred to as the Max-Log-BCJR algorithm or the Log-BCJR algorithm) or soft-output Viterbi algorithm (SOVA) decoding. The soft-output decoder circuit 250 receives the soft-input received value D206 received by the receiver and soft-input a-priori probability information D207 that is supplied from the interleaver 270 and that corresponds to information bits and performs soft-output decoding of the inner code using the received value D206 and the a-priori probability information D207. The soft-output decoder circuit 250 generates extrinsic information D208 that corresponds to information bits and that is obtained in accordance with the code's constraint condition and outputs the extrinsic information D208 serving as soft-output to the de-interleaver 260 at a subsequent stage. The extrinsic information D208 corresponds to the interleaved data D203 that has been interleaved by the interleaver 220 of the encoding device 201.

The de-interleaver 260 de-interleaves the soft-input extrinsic information D208 output from the soft-output decoder circuit 250 so as to rearrange the bit sequence of the interleaved data D203 that has been interleaved by the interleaver 220 of the encoding device 201 to the bit sequence of the original encoded data D202. The de-interleaver 260 outputs the de-interleaved data serving as a-priori probability information D209 corresponding to encoded bits to the soft-output decoder circuit 280 at a subsequent stage.

The interleaver 270 interleaves soft-input extrinsic information D210 that is output from the soft-output decoder circuit 280 and that corresponds to encoded bits on the basis of the same rearrangement position information as that of the interleaver 220 of the encoding device 201. The interleaver 270 outputs the interleaved data serving as the a-priori probability information D207 corresponding to the information bits to the soft-output decoder circuit 250.

The soft-output decoder circuit 280 is associated with the convolutional encoder 210 of the encoding device 201. As in the case with the soft-output decoder circuit 250, the soft-output decoder circuit 280 performs MAP decoding based on the above-described BCJR algorithm, Max-Log-BCJR algorithm, or Log-BCJR algorithm or SOVA decoding. The soft-output decoder circuit 280 receives the soft-input a-priori probability information D209 that is output from the de-interleaver 260 and that corresponds to the encoded bits and a-priori probability information (not shown) that has a value of zero and that corresponds to information bits and performs soft-output decoding of the outer code using these pieces of a-priori probability information. The soft-output decoder circuit 280 generates the extrinsic information D210 that corresponds to the encoded bits and that is obtained in accordance with the code's constraint condition and outputs the extrinsic information D210, serving as soft-output, to the interleaver 270. The soft-output decoder circuit 280 also generates so-called a-posteriori probability information (not shown) that corresponds to information bits and that is obtained in accordance with the code's constraint condition and outputs hard-output decoded data D211 on the basis of the a-posteriori probability information.

When the decoding device 203 described above receives the received value D206, the decoding device 203 iterates the decoding operation involving the circuits from the soft-output decoder circuit 250 to the soft-output decoder circuit 280 a predetermined number of times, such as a few times to several dozen times, and outputs the decoded data D211 on the basis of the soft-output extrinsic information obtained as a result of the decoding operation performed the predetermined number of times.

One criterion for code design is referred to as the maximum likelihood (ML) criterion. A performance curve for representing the code performance is drawn in terms of the relationship between the bit error rate represented logarithmically ($\log_{10}$BER) and the signal-to-noise power ratio per bit ($E_b/N_o$). The performance curve has a bit error rate at which a so-called error floor occurs, that is, the bit error rate cannot be reduced any further by increasing the signal-to-noise power ratio. The ML criterion is a criterion for reducing the bit error rate at which the error-floor occurs, that is, a criterion for optimizing the weight distribution of the overall code.

The error floor is known to be determined by a code's distance structure. Specifically, a term that dominates the bit error rate at which an error floor occurs in a code with block length N is represented by expression (1) where $d_f^0$ denotes the minimum distance of the outer code. When the outer code's minimum distance $d_f^0$ is an even number, $\delta^2$ is expressed by equation (2) where $d_{f,eff}$ denotes the minimum effective Euclidean distance of the inner code. When the outer code's minimum distance $d_f^0$ is an odd number, $\delta^2$ is expressed by equation (3) where $h_m^{(3)}$ denotes the minimum Euclidean distance with respect to an input Hamming distance of three.

$$N^{-\lfloor (d_f^0+1)/2 \rfloor} e^{-\delta^2(E_b/4N_0)} \qquad (1)$$

where $\lfloor x \rfloor$ denotes the integer portion of real number x.

$$\delta^2 = \frac{d_f^0 d_{f,eff}^2}{2} \qquad (2)$$

$$\delta^2 = \frac{(d_f^0 - 3) d_{f,eff}^2}{2} + (h_m^{(3)})^2 \qquad (3)$$

The term that dominates the bit error rate at which the error floor occurs in the code having block length N depends on the inner code's Euclidean distance with respect to an input distance of two when the outer code's minimum distance $d_f^0$ is an even number, and it depends on the inner code's Euclidean distance with respect to input distances of two and three when the outer code's minimum distance $d_f^0$ is an odd number. In code design, maximizing the Euclidean distance is a condition for achieving a low error rate.

In order to perform code design in view of the ML criterion for reducing the bit error rate at which such an error floor occurs, the following five steps should be taken.

In code design, first, the so-called set partitioning technique or the like is used to optimize the distribution of output distances, thus creating a trellis that is not catastrophic.

Subsequently, in code design, the output distance with respect to an input Hamming distance of one is set to infinity in order not to generate many codewords with a low output distance. In other words, in code design, for example, such a path that branches off at a state on a trellis with an input Hamming distance of one, reaches another state, and returns to the original state with an input Hamming distance of zero is eliminated. As a result, the trellis does not terminate with an input Hamming distance of one. In the case of a code following such a path, even if an interleaver is provided, when the outer code's distance is small, the outer code is interspersed by the interleaver into the input code. Due to the fact that every bit sequence generates a small output distance, many termination patterns are generated, resulting in a high error floor.

Code design thus observes the ML criterion. Specifically, in code design, the inner code's output distance with respect to an input distance of two is maximized. When the outer code's minimum distance $d_f^0$ is an odd number, the inner code's output distance with respect to an input distance of three is maximized. In code design, when a code is constructed in accordance with the ML criterion, the code's weight distribution is optimized. As a result, the error floor is reduced.

Subsequently, in code design, input and output positions are mapped onto the trellis so as to satisfy both conditions, that is, the condition that the trellis does not terminate with an input Hamming distance of one and the condition that the ML criterion is observed.

In code design, the output of an encoder is set to the positions of signal points so that the output can be represented in terms of a convolution code.

In code design, the above-described steps are taken to design a code with a low error floor.

A specific example of SCTCM code design by taking these steps is described in D. Divsalar, S Dolinar, and F. Pollara, "Serial Concatenated Trellis Coded Modulation with Rate-1 Inner Code", GLOBECOM 2000, which will now be described.

In this paper, a convolutional encoder 300 shown in FIG. 18 is used as a convolutional encoder that encodes the inner code. Specifically, the convolutional encoder 300 includes three exclusive OR circuits 301, 302, and 303 and a shift register 304.

The exclusive OR circuit 301 computes the exclusive OR of data supplied from the shift register 304 and input interleaved data $D301_1$ and supplies the computation result as 1-bit encoded data $D302_1$ of 3-bit encoded data D302 to a multi-level modulation mapping circuit (not shown) at a subsequent stage.

The exclusive OR circuit 302 computes the exclusive OR of the input interleaved data $D301_1$ and $D301_2$ and outputs the computation result as 1-bit encoded data $D302_2$ of the 3-bit encoded data D302 to the multi-level modulation mapping circuit at the subsequent stage.

The exclusive OR circuit 303 computes the exclusive OR of data supplied from the shift register 304 and the input interleaved data $D301_1$, $D301_2$, and $D301_3$. The exclusive OR circuit 303 supplies the computation result to the shift register 304 and outputs the computation result as 1-bit encoded data $D302_3$ of the 3-bit encoded data D302 to the multi-level modulation mapping circuit at the subsequent stage.

The shift register 304 continuously supplies 1-bit data maintained therein to the exclusive OR circuits 301 and 303. In synchronization with a clock signal, the shift register 304 maintains new 1-bit data supplied from the exclusive OR circuit 303 and supplies the new data to the exclusive OR circuits 301 and 303.

When the convolutional encoder 300 described above receives the 3-bit interleaved data $D301_1$, $D301_2$, and $D302_3$, the convolutional encoder 300 performs a convolutional operation of the input data $D301_1$, $D301_2$, and $D302_3$ and outputs the operation result as the 3-bit encoded data $D302_1$, $D302_2$, and $D302_3$ to the multi-level modulation mapping circuit at the subsequent stage. In other words, the convolutional encoder 300 performs a convolutional operation to encode the inner code with a code rate of 3/3=1 and outputs the encoded data D302 to the multi-level modulation mapping circuit at the subsequent stage.

In this paper, the encoded data $D302_1$, $D302_2$, and $D302_3$ generated by the convolutional encoder 300 described above are, as shown in FIG. 19, mapped by the multi-level modulation mapping circuit onto a transmission symbol in 8PSK. Referring to FIG. 19, the values of the transmission symbol assigned to each signal point indicate ($D302_1$, $D302_2$, $D303_3$).

In this paper, a trellis shown in FIG. 20 is generated by encoding the inner code by the convolutional encoder 300 and assigning the encoded data to the signal points by the multi-level modulation mapping circuit. Specifically, the trellis uses $S_0$ to represent states when the contents of the shift register 304 of the convolutional encoder 300 are zero, $S_1$ to represent states when the contents of the shift register 304 indicate one, and $(D301_1, D301_2, D301_3)/(D302_1, D302_2, D302_3)$ to represent the input/output label attached to each path. In such a case, the input/output labels 000/000, 011/010, 101/110, and 110/100 are assigned to parallel paths consisting of four paths extending from state $S_0$ to state $S_0$; the input/output labels 001/001, 010/011, 100/111, and 111/101 are assigned to parallel paths consisting of four paths extending from state $S_0$ to state $S_1$; the input/output labels 111/000, 100/010, 010/110, and 001/100 are assigned to parallel paths consisting of four paths extending from state $S_1$ to state $S_0$; and the input/output labels 110/001, 101/011, 011/111, and 000/101 are assigned to parallel paths consisting of four paths extending from state $S_1$ to state $S_1$.

A specific method for creating such a trellis that is not catastrophic will now be described.

In this paper, a trellis that is not catastrophic is created by assigning encoded data to appropriate signal points using the above-described set partitioning technique. Specifically, in this paper, eight signal points in 8PSK [0, 1, 2, 3, 4, 5, 6, 7, 8] shown in FIG. 21A are divided into two sets A=[0, 2, 4, 6] and B=[1, 3, 5, 7], as shown in FIGS. 21B and 21C, respectively. In the following description, the elements of the set A are denoted by $[A_0, A_2, A_4, A_6]$, and the elements of the set B are denoted by $[B_1, B_3, B_5, B_6]$. The squared minimum distance between the signal points shown in FIG. 21A is 0.59, whereas the squared minimum distance between the signal points shown in FIGS. 21B and 21C is 2.

In the sets A and B, the signal points are assigned so that the input Hamming distance between parallel paths is two. A specific trellis is shown in FIG. 22. The input labels 000, 011, 101, and 110 are assigned to parallel paths consisting of four paths extending from state $S_0$ to state $S_0$; the input labels 001, 010, 100, and 111 are assigned to parallel paths consisting of four paths extending from state $S_0$ to state $S_1$; the input labels 111, 100, 010, and 001 are assigned to parallel paths consisting of four paths extending from state $S_1$ to state $S_0$; and the input labels 110, 101, 011, and 000 are assigned to parallel paths consisting of four paths extending from state $S_1$ to state $S_1$.

The input elements of the parallel paths consisting of four paths extending from state $S_1$ to state $S_0$ are the same as those of the parallel paths consisting of four paths extending from state $S_0$ to state $S_1$ but in a different order. The input elements of the parallel paths consisting of four paths extending from state $S_1$ to state $S_1$ are the same as those of the parallel paths consisting of four paths extending from state $S_0$ to state $S_0$ but in a different order.

In this trellis, the outputs of transitions from state $S_0$ to state $S_0$ and the outputs of transitions from state $S_1$ to state $S_0$ constitute the set A, and the outputs of transitions from state $S_0$ to state $S_1$ and the outputs of transitions from state $S_1$ to state $S_1$ constitute the set B.

The outputs of transitions from state $S_1$ to state $S_0$ constitute the set A and the outputs of transitions from state $S_1$ to state $S_1$ constitute the set B because, if the outputs of transitions from state $S_1$ to state $S_0$ constitute the set B, the outputs of transitions from state $S_1$ to state $S_1$ constitute the set A. As a result, the output of the path from state $S_0 \to$ state $S_0 \to$ state $S_0$ becomes the same as the output of the path from state $S_1 \to$ state $S_1 \to$ state $S_1$, resulting in a catastrophic trellis.

The input elements of transitions from state $S_1$ to state $S_0$ are the same as those of transitions from state $S_0$ to state $S_1$, and the input elements of transitions from state $S_1$ to state $S_1$ are the same as those of transitions from state $S_0$ to state $S_0$ because, if the input elements of transitions from state $S_1$ to state $S_0$ are the same as those of transitions from state $S_0$ to state $S_0$, some of the paths from state $S_0 \to$ state $S_0 \to$ state $S_0$ and the paths from state $S_0 \to$ state $S_1 \to$ state $S_0$ have a small output Euclidean distance with an input Hamming distance of one. When such an inner code is concatenated with the outer code via the interleaver, many codewords having a small distance are generated.

Each branch leaving state $S_0$ of the trellis shown in FIG. 22 may have arbitrary input/output assignment among the elements of the set A or the set B. For example, as shown in FIG. 23, element $A_0$ of the set A is assigned as the output label to the input label 000; element $A_2$ of the set A is assigned as the output label to the input label 011; element $A_4$ of the set A is assigned as the output label to the input label 101; and element $A_6$ of the set A is assigned as the output label to the input label 110. At the same time, element $B_1$ of the set B is assigned as the output label to the input label 001; element $B_3$ of the set B is assigned as the output label to the input label 010; element $B_5$ of the set B is assigned as the output label to the input label 100; and element $B_7$ of the set B is assigned as the output label to the input label 111.

Each branch leaving state $S_1$ of the trellis is determined subject to maximizing the output distance with respect to an input distance of two.

FIG. 24 shows paths with an input distance of two, on the basis of the all-zero path. Each of the elements $A_?$ shown in FIG. 24 may by one of A0, A2, A4, and A6. Thus, the sum of squares of the distances of the paths is expressed as:

$$\begin{cases} B_1 + A_0 = 0.59 + 0 = 0.59 \\ B_1 + A_2, A_6 = 0.59 + 2 = 2.59 \\ B_1 + A_4 = 0.59 + 4 = 4.59 \\ B_3, B_5 + A_0 = 3.41 + 0 = 3.41 \\ B_3, B_5 + A_2, A_6 = 3.41 + 2 = 5.41 \\ B_3, B_5 + A_4 = 3.41 + 4 = 7.41 \end{cases} \quad (4)$$

One of the elements other than $A_0$ is assigned to paths with an input distance of one, which are among the parallel paths consisting of four paths extending from state $S_1$ to state $S_0$, thus maximizing the output distance with respect to an input distance of two. In other words, as shown in FIG. 25, the element $A_0$ is assigned to only one path with an input distance of three, which is one of the parallel paths consisting of four paths extending from state $S_1$ to state $S_0$.

Similarly, as shown in FIG. 26, the inputs corresponding to the elements $A_2, A_4,$ and $A_6$ are assigned in such a manner that, of the parallel paths consisting of four paths extending from state $S_0$ to state $S_0$ and the parallel paths consisting of four paths extending from state $S_1$ to state $S_0$, the corresponding paths between which the input distance is three have the same signal point.

The parallel paths consisting of four paths extending from state $S_1$ to state $S_1$ are considered using FIG. 27. Specifically, in the trellis shown in FIG. 27, of the parallel paths consisting of four paths extending from state $S_1$ to state $S_1$, there are only three paths with an input distance of one, that is, 000/B?, 011/B?, and 101/B?, on the basis of the path with the input label 001.

As in the case with the above discussion, of the parallel paths consisting of four paths extending from state $S_1$ to state $S_1$, 110 is assigned to the input of the path having the element B1 as the output, where 110 has an input distance of three on the basis of the path with the input label 001. Similarly, the inputs corresponding to the elements $B_3, B_5,$ and $B_7$ are assigned in such a manner that, of the parallel paths consisting of four paths extending from state $S_0$ to state $S_1$ and the parallel paths consisting of four paths extending from state $S_1$ to state $S_1$, the corresponding paths between which the input distance is three have the same signal point.

As a result of such operations, the input/output labels assigned to the paths in the trellis are shown in FIG. 28.

When the convolutional encoder 300 shown in FIG. 18 is used to encode the inner code, the elements $A_0$, $A_2$, $A_4$, and $A_6$ of the set A become 000, 010, 110, and 110, respectively, and the elements $B_1$, $B_3$, $B_5$, and $B_7$ of the set B become 001, 011, 111, and 101, respectively. Accordingly, a trellis that is not catastrophic, shown in FIG. 20, is created.

In an encoding device that performs mapping of the inner code to the signal points, which is described in the paper by Divsalar, et al., an output distance distribution with respect to an input distance of two is computed as follows.

Since the encoding device performs trellis coded modulation (hereinafter referred to as TCM), if the distance distributions on the basis of all paths are not the same, that is, if the trellis is not symmetrical, the average of the distance distributions need to be computed.

In the case of the above-described mapping of the inner code to the signal points, a state transition diagram on the basis of the all-zero path is shown in FIG. 29. Referring to FIG. 29, a multiplier of Y indicates an input distance and a multiplier of X indicates a squared output distance. In the state transition diagram, the paths with an input distance of two are shown in terms of a state transition diagram in FIG. 30.

An output distance distribution with respect to an input distance of two is expressed by:

$$2X^2 + X^4 + \sum_{n=0}^{\infty} (X^{0.59} + 2X^{3.41})(X^{0.59})^n (2X^2 + X^4) = \quad (5)$$
$$2X^2 + 2X^{2.59} + 2X^{3.18} + 2X^{3.77} + X^4 + \cdots$$

In a state transition diagram on the basis of $A_2$–$A_2$, the paths with an input distance of two are shown in FIG. 31 in which the coefficient of the transition from state $S_0$ to state $S_1$ shown in FIG. 31 differs from that shown in FIG. 30.

Therefore, an output distance distribution with respect to an input distance of two is expressed by:

$$2X^2 + X^4 + \sum_{n=0}^{\infty} (2X^{0.59} + X^{3.41})(X^{0.59})^n (2X^2 + X^4) = \quad (6)$$
$$2X^2 + 4X^{2.59} + 4X^{3.18} + 4X^{3.77} + X^4 + \cdots$$

Two halves of all of the remaining paths have distance distributions expressed by equation (5) and equation (6), respectively. The average of the output distance distributions is expressed by:

$$2X^2 + 3X^{2.59} + 3X^{3.18} + 3X^{3.77} + X^4 + \ldots \quad (7)$$

In the convolutional encoders 230 and 300 shown in FIGS. 16 and 18, the number of shift registers, that is, the number of memories, is one. Thus, the number of states is two. Such convolutional encoders with one memory do not terminate with an input distance of one; instead, they always terminate with an input distance of two. In other words, such convolutional encoders never terminate with an odd-numbered input distance.

In the above-described paper by Divsalar et al. in which such a convolutional encoder is used as an inner-code encoder, if the outer code has a minimum distance of three, the encoder does not terminate even with an inner code's input distance of three, resulting in a code with a large output distance. The overall resultant code thus has a performance effectively equivalent to that of a case in which the outer code has a minimum distance of four.

On the other hand, the above paper does not discuss a case in which an encoder with two or more memories is applied to encode the inner code.

This discussion is also applicable to SCCC coding.

SUMMARY OF THE INVENTION

Accordingly, it is an object of the present invention to provide an encoding device and method for proposing, in SCCC coding and/or SCTCM coding, new guiding principles for applying an encoder with two memories to an inner code and improving the performance and to provide a decoding device and method for decoding with high accuracy a code in SCCC and/or a code in SCTCM generated by such encoding device and method.

In order to achieve the above-described objects, according to an aspect of the present invention, an encoding device that performs serially concatenated convolutional coding or serial concatenated trellis coded modulation of input data is provided. The encoding device includes a first component encoder for performing predetermined encoding of the input data; an interleaver for permuting first encoded data generated by the encoding by the first component encoder; and a second component encoder for performing predetermined encoding of interleaved data generated by the interleaver to generate second encoded data, the second component encoder being serially concatenated with the interleaver. The second component encoder includes two or more storage elements for storing data. The first encoded data generated by the first component encoder has a minimum output distance greater than the maximum input distance at which a minimum-distance code is generated by the second component encoder.

The encoding device according to the present invention uses, when an inner code is encoded by the second component encoder having two or more storage elements, an encoder, serving as the first component encoder for encoding an outer code, for generating the first encoded data having a minimum output distance greater than the maximum input distance at which a minimum-distance code is generated by the second component encoder. Accordingly, the bit error rate with a high signal-to-noise power ratio is improved, and high-performance coding is performed.

In order to achieve the above-described objects, according to another aspect of the present invention, an encoding method for performing serially concatenated convolutional coding or serial concatenated trellis coded modulation of input data is provided. The encoding method includes a first component encoding step of performing predetermined encoding of the input data; an interleaving step of permuting first encoded data generated by the encoding in the first component encoding step; and a second component encoding step of performing predetermined encoding of interleaved data generated in the interleaving step to generate second encoded data. In the second component encoding step, the encoding is performed using two or more storage elements for storing data. The first encoded data generated in the first component encoding step has a minimum output distance greater than the maximum input distance at which a minimum-distance code is generated in the second component encoding step.

The encoding method according to the present invention uses, when an inner code is encoded using two or more storage elements, an outer code that has a minimum output distance greater than the maximum input distance at which a minimum-distance inner code is generated. Accordingly, the bit error rate with a high signal-to-noise power ratio is improved, and high-performance coding is performed.

In order to achieve the above-described objects, according to yet another aspect of the present invention, a decoding device is provided that decodes a code generated by serially concatenated convolutional coding or serial concatenated trellis coded modulation by an encoding device including a first component encoder for performing predetermined encoding of input data; a first interleaver for permuting first encoded data generated by the encoding by the first component encoder; and a second component encoder for performing predetermined encoding of interleaved data generated by the first interleaver to generate second encoded data. The second component encoder is serially concatenated with the first interleaver. The second component encoder includes two or more storage elements for storing data. The first encoded data generated by the first component encoder has a minimum output distance greater than the maximum input distance at which a minimum-distance code is generated by the second component encoder. The decoding device includes a first soft-output decoder for receiving a soft-input received value and a-priori probability information corresponding to information bits, performing soft-output decoding, and generating first extrinsic information at each time, the first soft-output decoder being associated with the second component encoder; a de-interleaver for permuting the soft-input first extrinsic information generated by the first soft-output decoder so that the order of the interleaved data permuted by the first interleaver is rearranged to the order of the first encoded data generated by the encoding by the first component encoder, the de-interleaver being serially concatenated with the first soft-output decoder; a second soft-output decoder for performing soft-output decoding using soft-input a-priori probability information that is generated by the de-interleaver and that corresponds to encoded bits and soft-input a-priori probability information corresponding to the information bits and generating a-posteriori probability information and/or second extrinsic information corresponding to the information bits at each time, the second soft-output decoder being associated with the first component encoder and being serially concatenated with the de-interleaver; and a second interleaver for permuting, on the basis of the same rearrangement position information as that of the first interleaver, the soft-input second extrinsic information generated by the second soft-output decoder. The first soft-output decoder receives, as the a-priori probability information corresponding to the information bits, the soft-input second extrinsic information generated by the second interleaver.

The decoding device according to the present invention decodes, when an inner code is encoded by the second component encoder having two or more storage elements, a code that is generated using an encoder, serving as the first component encoder for encoding an outer code, for generating the first encoded data having a minimum output distance greater than the maximum input distance at which a minimum-distance code is generated by the second component encoder. Accordingly, a code having an improved bit error rate with a high signal-to-noise power ratio is decoded with high accuracy.

In order to achieve the above-described objects, according to a further aspect of the present invention, a decoding method is provided for decoding a code generated by serially concatenated convolutional coding or serial concatenated trellis coded modulation by an encoding method including a first component encoding step of performing predetermined encoding of input data; an interleaving step of permuting first encoded data generated by the encoding in the first component encoding step; and a second component encoding step of performing predetermined encoding of interleaved data generated in the interleaving step to generate second encoded data. In the second component encoding step, the encoding is performed using two or more storage elements for storing data. The first encoded data generated in the first component encoding step has a minimum output distance greater than the maximum input distance at which a minimum-distance code is generated in the second component encoding step. The decoding method includes a first soft-output decoding step of receiving a soft-input received value and a-priori probability information corresponding to information bits, performing soft-output decoding, and generating first extrinsic information at each time, the first soft-output decoding step being associated with the second component encoding step; a de-interleaving step of permuting the soft-input first extrinsic information generated in the first soft-output decoding step so that the order of the interleaved data permuted in the first interleaving step is rearranged to the order of the first encoded data generated in the encoding in the first component encoding step; a second soft-output decoding step of performing soft-output decoding using soft-input a-priori probability information that is generated in the de-interleaving step and that corresponds to encoded bits and soft-input a-priori probability information corresponding to the information bits and generating a-posteriori probability information and/or second extrinsic information corresponding to the information bits at each time, the second soft-output decoding step being associated with the first component encoding step; and a second interleaving step of permuting, on the basis of the same rearrangement position information as that of the first interleaving step, the soft-input second extrinsic information generated in the second soft-output decoding step. In the first soft-output decoding step, the soft-input second extrinsic information generated in the second interleaving step is received as the a-priori probability information corresponding to the information bits.

The decoding method according to the present invention decodes, when an inner code is encoded using two or more storage elements, an outer code that has a minimum output distance greater than the maximum input distance at which a minimum-distance inner code is generated. Accordingly, a code having an improved bit error rate with a high signal-to-noise power ratio is decoded with high accuracy.

In order to achieve the above-described objects, according to another aspect of the present invention, an encoding device that performs serially concatenated convolutional coding or serial concatenated trellis coded modulation of input data is provided. The encoding device includes a first component encoder for performing predetermined encoding of the input data; an interleaver for permuting first encoded data generated by the encoding by the first component encoder; and a second component encoder for performing predetermined encoding of interleaved data generated by the interleaver to generate second encoded data, the second component encoder being serially concatenated with the interleaver. The second component encoder includes two or more storage elements for storing data, and the second encoded data generated thereby is not terminated with an odd-numbered input distance.

The encoding device according to the present invention uses, when an inner code is encoded by the second component encoder having two or more storage elements, an encoder for generating the second encoded data that is not terminated with an odd-numbered input distance. Accordingly, the bit error rate with a high signal-to-noise power ratio is improved while the decoding cost is suppressed, and high-performance coding is performed.

In order to achieve the above-described objects, according to yet another aspect of the present invention, an encoding method for performing serially concatenated convolutional coding or serial concatenated trellis coded modulation of input data is provided. The encoding method includes a first component encoding step of performing predetermined encoding of the input data; an interleaving step of permuting first encoded data generated by the encoding in the first component encoding step; and a second component encoding step of performing predetermined encoding of interleaved data generated in the interleaving step to generate second encoded data. In the second component encoding step, two or more storage elements for storing data are used, and the second encoded data generated thereby is not terminated with an odd-numbered input distance.

The encoding method according to the present invention uses, when an inner code is encoded using two or more storage elements, a code that is not terminated with an odd-numbered input distance. Accordingly, the bit error rate with a high signal-to-noise power ratio is improved while the decoding cost is suppressed, and high-performance coding is performed.

In order to achieve the above-described objects, according to a further aspect of the present invention, a decoding device is provided that decodes a code generated by serially concatenated convolutional coding or serial concatenated trellis coded modulation by an encoding device including a first component encoder for performing predetermined encoding of input data; an interleaver for permuting first encoded data generated by the encoding by the first component encoder; and a second component encoder for performing predetermined encoding of interleaved data generated by the interleaver to generate second encoded data, the second component encoder being serially concatenated with the interleaver. The second component encoder includes two or more storage elements for storing data, and the second encoded data generated thereby is not terminated with an odd-numbered input distance. The decoding device includes a first soft-output decoder for receiving a soft-input received value and a-priori probability information corresponding to information bits, performing soft-output decoding, and generating first extrinsic information at each time, the first soft-output decoder being associated with the second component encoder; a de-interleaver for permuting the soft-input first extrinsic information generated by the first soft-output decoder so that the order of the interleaved data permuted by the first interleaver is rearranged to the order of the first encoded data generated by the encoding by the first component encoder, the de-interleaver being serially concatenated with the first soft-output decoder; a second soft-output decoder for performing soft-output decoding using soft-input a-priori probability information that is generated by the de-interleaver and that corresponds to encoded bits and soft-input a-priori probability information corresponding to the information bits and generating a-posteriori probability information and/or second extrinsic information corresponding to the information bits at each time, the second soft-output decoder being associated with the first component encoder and being serially concatenated with the de-interleaver; and a second interleaver for permuting, on the basis of the same rearrangement position information as that of the first interleaver, the soft-input second extrinsic information generated by the second soft-output decoder. The first soft-output decoder receives, as the a-priori probability information corresponding to the information bits, the soft-input second extrinsic information generated by the second interleaver.

The decoding device according to the present invention decodes, when an inner code is encoded by the second component encoder having two or more storage elements, a code that is generated using an encoder that generates the second encoded data that is not terminated with an odd-numbered input distance. Accordingly, while the decoding cost is suppressed, a code having an improved bit error rate with a high signal-to-noise power ratio is decoded with high accuracy.

In order to achieve the above-described objects, according to another aspect of the present invention, a decoding method is provided for decoding a code generated by serially concatenated convolutional coding or serial concatenated trellis coded modulation by an encoding method including a first component encoding step of performing predetermined encoding of input data; an interleaving step of permuting first encoded data generated by the encoding in the first component encoding step; and a second component encoding step of performing predetermined encoding of interleaved data generated in the interleaving step to generate second encoded data. In the second component encoding step, two or more storage elements for storing data are used, and the second encoded data generated thereby is not terminated with an odd-numbered input distance. The decoding method includes a first soft-output decoding step of receiving a soft-input received value and a-priori probability information corresponding to information bits, performing soft-output decoding, and generating first extrinsic information at each time, the first soft-output decoding step being associated with the second component encoding step; a de-interleaving step of permuting the soft-input first extrinsic information generated in the first soft-output decoding step so that the order of the interleaved data permuted in the first interleaving step is rearranged to the order of the first encoded data generated by the encoding in the first component encoding step; a second soft-output decoding step of performing soft-output decoding using soft-input a-priori probability information that is generated in the de-interleaving step and that corresponds to encoded bits and soft-input a-priori probability information corresponding to the information bits and generating a-posteriori probability information and/or second extrinsic information corresponding to the information bits at each time, the second soft-output decoding step being associated with the first component encoding step; and a second interleaving step of permuting, on the basis of the same rearrangement position information as that of the first interleaving step, the soft-input second extrinsic information generated in the second soft-output decoding step. In the first soft-output decoding step, the soft-input second extrinsic information generated in the second interleaving step is received as the a-priori probability information corresponding to the information bits.

The decoding method according to the present invention decodes, when an inner code is encoded using two or more storage elements, a code that does not terminate with an odd-numbered input distance. Accordingly, while the decoding cost is suppressed, a code having an improved bit error rate with a high signal-to-noise power ratio is decoded with high accuracy.

BRIEF DESCRIPTION OF THE DRAWINGS

FIG. 21A illustrates eight signal points [0, 1, 2, 3, 4, 5, 6, 7, 8]; FIG. 21B illustrating a set A=[0, 2, 4, 6], which is generated by dividing the signal points using a set partitioning technique; and FIG. 21C illustrating a set B=[1, 3, 5, 7], which is generated by dividing the signal points using the set partitioning technique;

DESCRIPTION OF THE PREFERRED EMBODIMENTS

With reference to the drawings, embodiments of the present invention will be described in detail.

Figure 1:
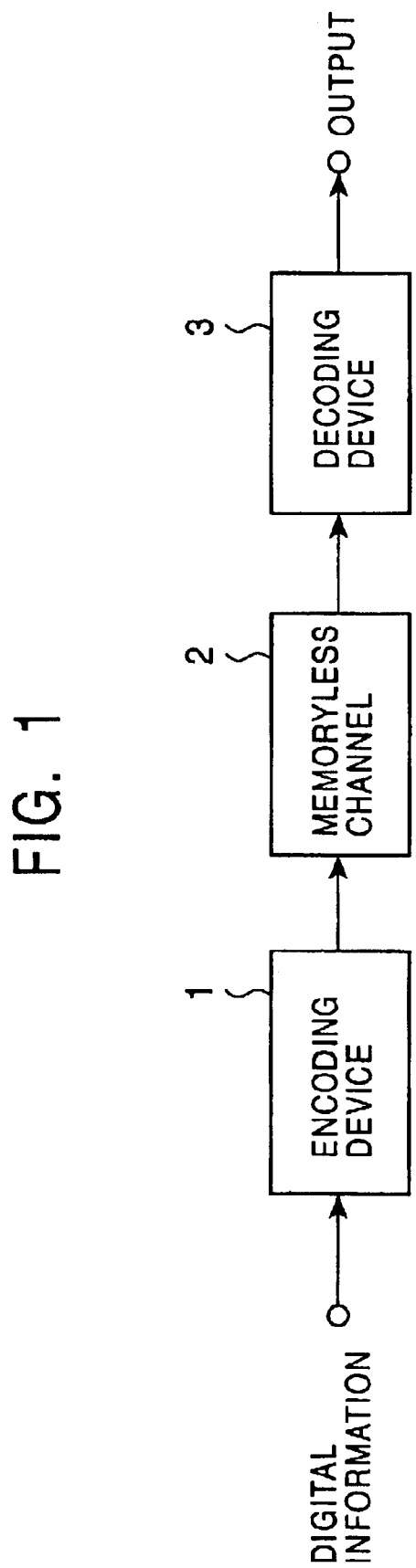
FIG. 1 is a block diagram of the configuration of a communication model to which a data transmission/reception system according to an embodiment of the present invention is applied.

Referring to FIG. 1, a data transmission/reception system according to an embodiment of the present invention is applied to a communication model that encodes digital information using an encoding device 1 included in a transmitter (not shown), inputs the output of the encoding device 1 to a receiver (not shown) via a memoryless channel 2 with noise, and decodes the output using a decoding device 3 included in the receiver.

In the data transmission/reception system, the encoding device 1 performs SCCC coding and/or SCTCM coding. Such coding is known as one type of so-called turbo coding. In the encoding device 1, a plurality of component encoders and an interleaver that permutes input data are concatenated to perform turbo coding. The encoding device 1 uses an encoder with two or more memories to encode an inner code, proposing new guiding principles for improving the performance.

The decoding device 3 decodes codes encoded by the encoding device 1. The decoding device 3 performs MAP decoding based on the BCJR algorithm, Max-Log-BCJR algorithm, or Log-BCJR algorithm. In the decoding device 3, a plurality of soft-output decoder circuits that compute soft-outputs corresponding to so-called a-posteriori probability information and/or so-called extrinsic information and an interleaver that permutes input data are concatenated to perform iterative decoding.

In the following description, in order to simplify the description, it is assumed that the encoding device 1 performs SCTCM coding and that a convolutional encoder with two memories is used as an encoder that encodes an inner code, which is included in the encoding device 1.

Figure 2:
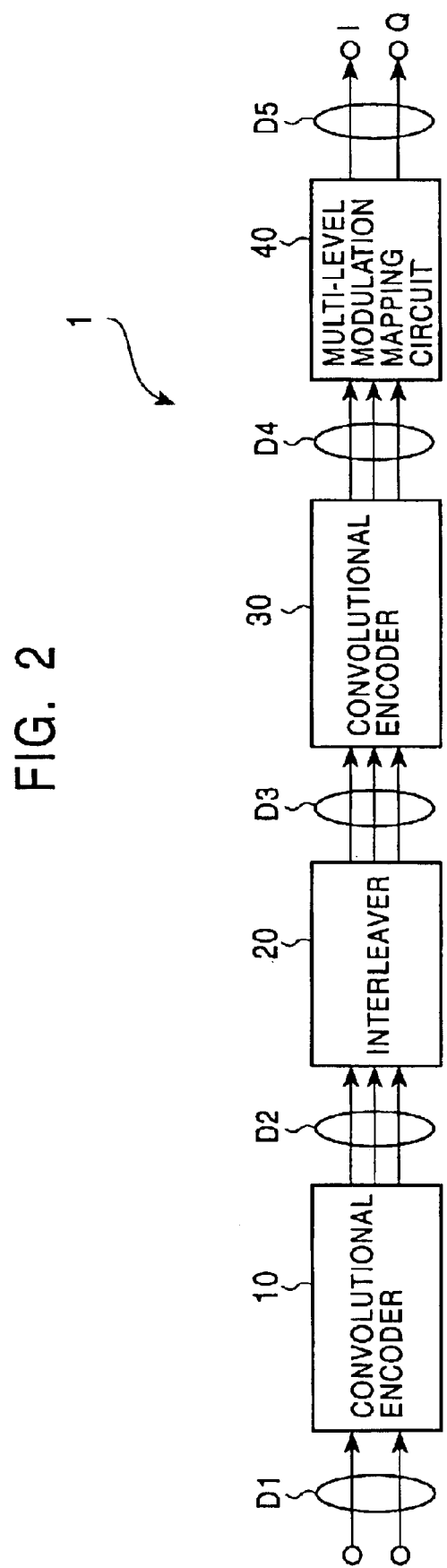
FIG. 2 is a block diagram of the configuration of an encoding device in the data transmission/reception system.

For example, referring to FIG. 2, the encoding device 1 includes a convolutional encoder 10 that encodes an outer code, an interleaver 20 that permutes input data, a convolutional encoder 30 that encodes an inner code, and a multi-level modulation mapping circuit 40 that performs signal-point mapping based on a predetermined modulation system. The encoding device 1 performs a serially concatenated convolutional operation on 2-bit input data D1 with a code rate of 2/3 to convert the input data D1 into 3-bit encoded data D4, maps the encoded data D4 to an 8PSK transmission symbol, and outputs a resultant 3-bit encoded transmission symbol D5.

When the convolutional encoder 10 (a detailed description thereof will be given later) receives the 2-bit input data D1, the convolutional encoder 10 performs a convolutional operation of the input data D1 and outputs the operation result as the 3-bit encoded data D2 to the interleaver 20 at a subsequent stage. In other words, the convolutional encoder 10 performs a convolutional operation to encode the outer code with a code rate of 2/3 and outputs the generated encoded data D2 to the interleaver 20 at the subsequent stage.

Figure 3:
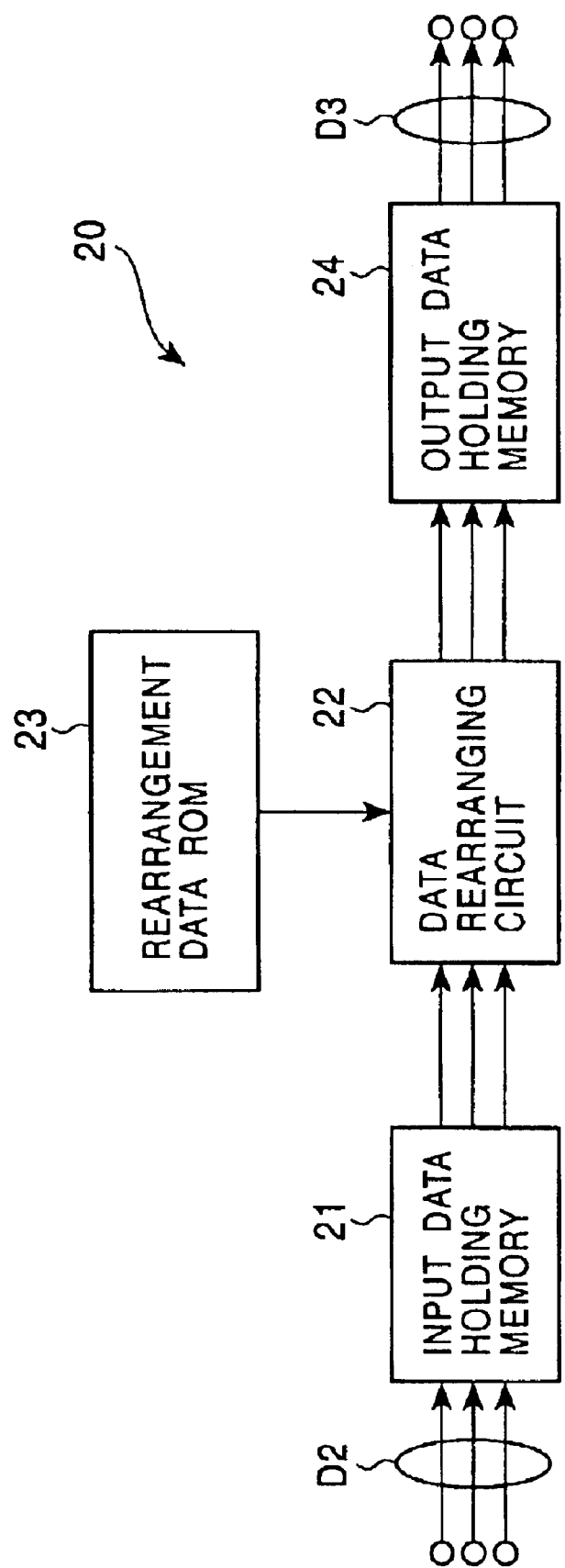
FIG. 3 is a block diagram of the configuration of an interleaver included in the encoding device shown in FIG. 2.

Referring to FIG. 3, the interleaver 20 includes an input data holding memory 21 that holds input data, a data rearranging circuit 22 that permutes (rearranges) input data, a rearrangement data ROM (Read Only Memory) 23 that stores data rearrangement position information, and an output data holding memory 24 that holds data to output.

The input data holding memory 21 holds the encoded data D2 consisting of a 3-bit sequence output from the convolutional encoder 10 and supplies the encoded data D2 at a predetermined time to the data rearranging circuit 22.

On the basis of the data rearrangement position information stored in the rearrangement data ROM 23, the data rearranging circuit 22 permutes the encoded data D2 supplied from the input data holding memory 21. The data rearranging circuit 22 supplies the permuted data to the output data holding memory 24.

The rearrangement data ROM 23 stores data rearrangement position information that is determined on the basis of, for example, a generated random number. In other words, the interleaver 20 is a random interleaver that interleaves data on the basis of the rearrangement position information. The rearrangement position information stored in the rearrangement data ROM 23 is read at any appropriate time by the data rearranging circuit 22.

The output data holding memory 24 holds the data supplied from the data rearranging circuit 22 and outputs the data as interleaved data D3 consisting of a 3-bit sequence at a predetermined time to the convolutional encoder 30 at a subsequent stage.

The interleaver 20 described above interleaves the encoded data D2 consisting of the 3-bit sequence output from the convolutional encoder 10 and outputs the interleaved data D3 consisting of the generated 3-bit sequence to the convolutional encoder 30 at the subsequent stage.

When the convolutional encoder 30 (a detailed description thereof will be given later) receives the 3-bit input data D3, the convolutional encoder 10 performs a convolutional operation of the interleaved data D3 and outputs the operation result as the 3-bit encoded data D4 to the multi-level modulation mapping circuit 40 at a subsequent stage. In other words, the convolutional encoder 30 performs a convolutional operation to encode the inner code with a code rate of 3/3=1 and outputs the encoded data D4 to the multi-level modulation mapping circuit 40 at the subsequent stage.

In synchronization with a clock signal, the multi-level modulation mapping circuit 40 maps the encoded data D4 output from the convolutional encoder 30 to, for example, an 8PSK transmission symbol. Specifically, the multi-level modulation mapping circuit 40 maps the 3-bit encoded data D4 output from the convolutional encoder 30 as a single transmission symbol and generates a single encoded transmission symbol D5. The multi-level modulation mapping circuit 40 outputs the generated encoded transmission symbol D5 to the outside.

In the encoding device 1 described above, the convolutional encoder 10 performs a convolutional operation to encode the outer code with a code rate of 2/3 and the convolutional encoder 30 performs a convolutional operation to encode the inner code with a code rate of 1, resulting in performing serially concatenated convolutional operation with an overall code rate of $(2/3) \times 1 = 2/3$. The data encoded and modulated by the encoding device 1 is output via the memoryless channel 2 to the receiver.

Figure 4:
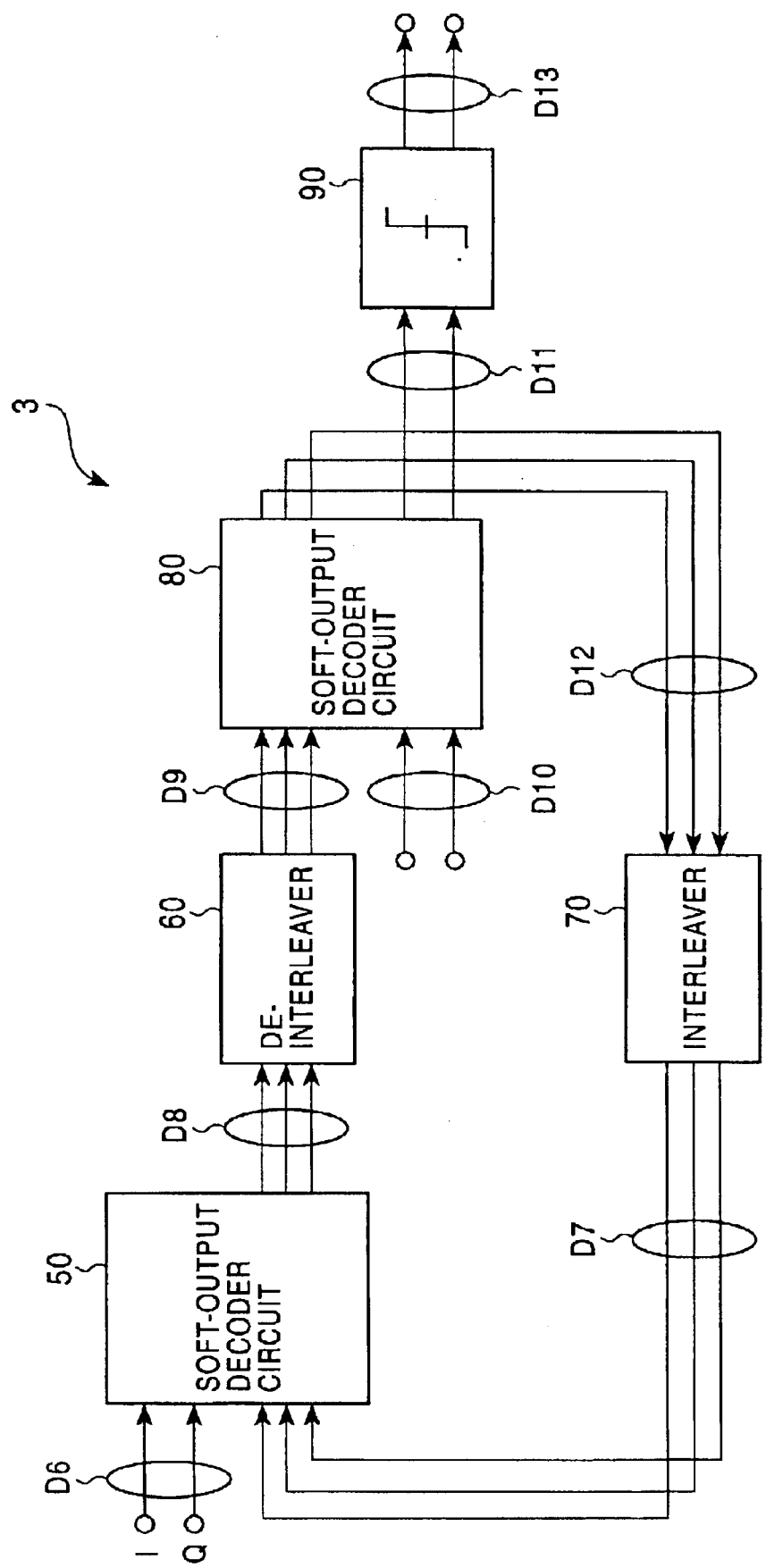
FIG. 4 is a block diagram of the configuration of a decoding device in the data transmission/reception system.

In contrast, referring to FIG. 4, the decoding device 3 includes a soft-output decoder circuit 50 that decodes the inner code, a de-interleaver 60 that rearranges the order of input data to the original order, an interleaver 70 that permutes input data, a soft-output decoder circuit 80 that decodes the outer code, and a binarization circuit 90 that binarizes input data. The decoding device 3 estimates the input data D1 of the encoding device 1 from a received value D6, which is an analog value due to the effects of noise generated on the memoryless channel 2 and which serves as soft-input, and outputs the estimated data as decoded data D13.

Figure 5:
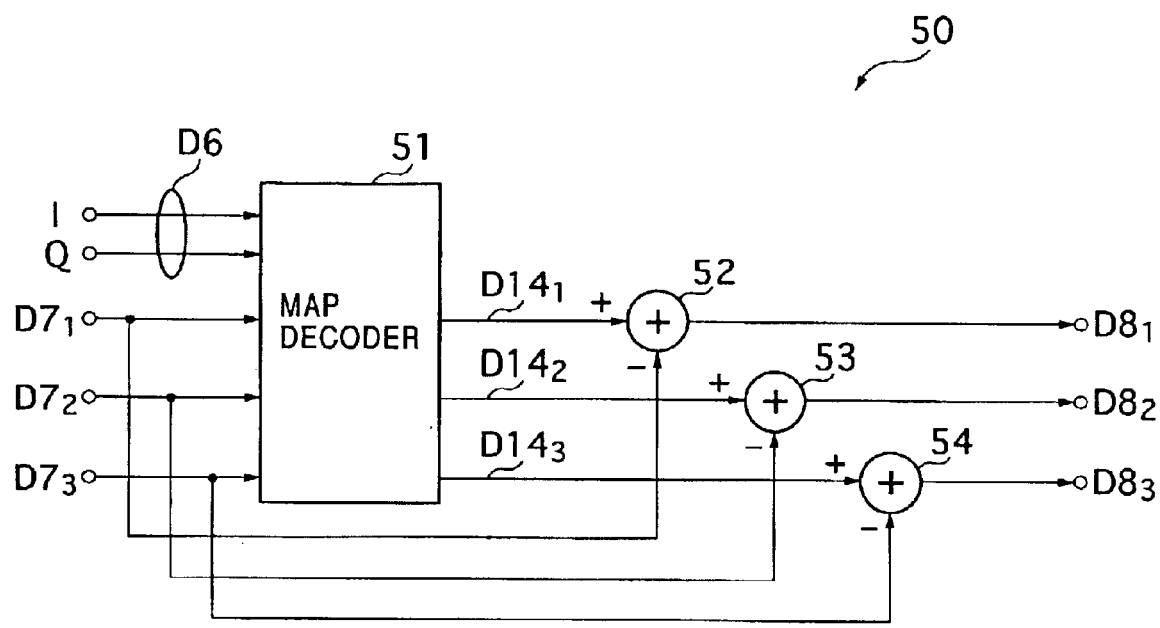
FIG. 5 is a block diagram of the configuration of a soft-output decoder circuit that is included in the decoding device shown in FIG. 4 and that performs soft-output decoding of an inner code.

The soft-output decoder circuit 50 is associated with the convolutional encoder 30 of the encoding device 1. Referring to FIG. 5, the soft-output decoder circuit 50 includes a MAP decoder 51 that performs MAP decoding based on the BCJR algorithm, Max-Log-BCJR algorithm, or Log-BCJR algorithm and three difference computing units 52, 53, and 54.

The MAP decoder 51 receives the soft-input received value D6 and soft-input a-priori probability information $D7_1$, $D7_2$, and $D7_3$ that are supplied from the interleaver 70 and that correspond to the 3-bit information bits, performs MAP decoding based on the BCJR algorithm, Max-Log-BCJR algorithm, or Log-BCJR algorithm, and generates a-posteriori probability information $D14_1$, $D14_2$, and $D14_3$ corresponding to the 3-bit information bits on the basis of the received value D6. The MAP decoder 51 supplies the generated a-posteriori probability information $D14_1$ to the difference computing unit 52, the generated a-posteriori probability information $D14_2$ to the difference computing unit 53, and the generated a-posteriori probability information $D14_3$ to the difference computing unit 54.

The difference computing unit 52 computes the difference between the soft-input a-posteriori probability information $D14_1$ and the soft-input a-priori probability information $D7_1$ and outputs the difference as 1-bit extrinsic information $D8_1$ of extrinsic information D8 that is obtained in accordance with the code's constraint condition and that corresponds to the 3-bit information bits, i.e., outputs the difference as soft-output, to the de-interleaver 60 at a subsequent stage.

The difference computing unit 53 computes the difference between the soft-input a-posteriori probability information $D14_2$ and the soft-input a-priori probability information $D7_2$ and outputs the difference as 1-bit extrinsic information $D8_2$ of the extrinsic information D8 corresponding to the 3-bit information bits, i.e., outputs the difference as soft-output, to the de-interleaver 60 at the subsequent stage.

The difference computing unit 54 computes the difference between the soft-input a-posteriori probability information $D14_3$ and the soft-input a-priori probability information $D7_3$ and outputs the difference as 1-bit extrinsic information $D8_3$ of the extrinsic information D8 corresponding to the 3-bit information bits, i.e., outputs the difference as soft-output, to the de-interleaver 60 at the subsequent stage.

The soft-output decoder circuit 50 described above receives the soft-input received value D6 received by the receiver and the soft-input a-priori probability information D7 that is supplied from the interleaver 70 and that corresponds to the information bits, performs MAP decoding based on the BCJR algorithm, Max-Log-BCJR algorithm, or Log-BCJR algorithm using the received value D6 and the a-priori probability information D7, and performs soft-output decoding of the inner code. The soft-output decoder circuit 50 generates the extrinsic information D8 obtained in accordance with the code's constraint condition and outputs the extrinsic information D8 as soft-output to the de-interleaver 60 at the subsequent stage.

More specifically, let u be an information bit, c be a coded bit, and y be the received value D6. The soft-output decoder circuit 50 inputs, to the MAP decoder 51, the received value D6 (y) and the a-priori probability information D7 (L(u)) expressed by:

$$L(u) = \frac{P(u=1)}{P(u=0)} \qquad (8)$$

In other words, the soft-output decoder circuit 50 inputs, to the MAP decoder 51, the received value D6 (y) and the a-priori probability information D7 (L(u)) that is free from the code's constraint condition and that is expressed in terms of a natural logarithm of the ratio of the probability of the information bit u being one P (u=1) to the probability of the information bit u being zero P (u=0).

Subsequently, in the soft-output decoder circuit 50, the MAP decoder 51 performs MAP decoding based on the BCJR algorithm, Max-Log-BCJR algorithm, or Log-BCJR algorithm and generates the a-posteriori probability information D14 (L*(u)) expressed by:

$$L^*(u) = \frac{P(u=1|y)}{P(u=0|y)} \qquad (9)$$

In other words, in the soft-output decoder circuit 50, the MAP decoder 51 generates the a-posteriori probability information D14 (L*(u)) that is based on the code's constraint condition and that is expressed in terms of a natural logarithm of the ratio of the probability of the information bit u being one when the received value D6 (y) is received P (u=1|y) to the probability of the information bit u being zero when the received value D6 (y) is received P (u=0|y). The a-posteriori probability information D14 (L*(u)) is also referred to as the log likelihood ratio and indicates the likelihood of the information bit u when the received value D6 (y) is received.

In the soft-output decoder circuit 50, the difference computing units 52, 53, and 54 compute the extrinsic information D8 ($L_e(u)$) that is the difference between the a-posteriori probability information D14 (L*(u)) and the a-priori probability information D7 (L(u)):

$$L_e(u) = L^*(u) - L(u) \qquad (10)$$

Accordingly, the soft-output decoder circuit 50 generates the extrinsic information D8 and outputs the extrinsic information D8 as soft-output to the de-interleaver 60 at the subsequent stage. The extrinsic information D8 corresponds to the interleaved data D3 generated by the interleaver 20 of the encoding device 1.

The de-interleaver 60 de-interleaves the soft-input extrinsic information D8 that is output from the soft-output decoder circuit 50 so that the bit sequence of the interleaved data D3 interleaved by the interleaver 20 of the encoding device 1 is rearranged to the bit sequence of the original encoded data D2. The de-interleaver 60 outputs the de-interleaved data serving as a-priori probability information D9 corresponding to encoded bits of the soft-output decoder circuit 80 at a subsequent stage.

The interleaver 70 interleaves soft-input extrinsic information D12 that is output from the soft-output decoder circuit 80 and that corresponds to encoded bits on the basis of the same rearrangement position information as that of the interleaver 20 of the encoding device 1. The interleaver 70 outputs the interleaved data serving as the a-priori probability information D7 corresponding to the information bits of the soft-output decoder circuit 50.

Figure 6:
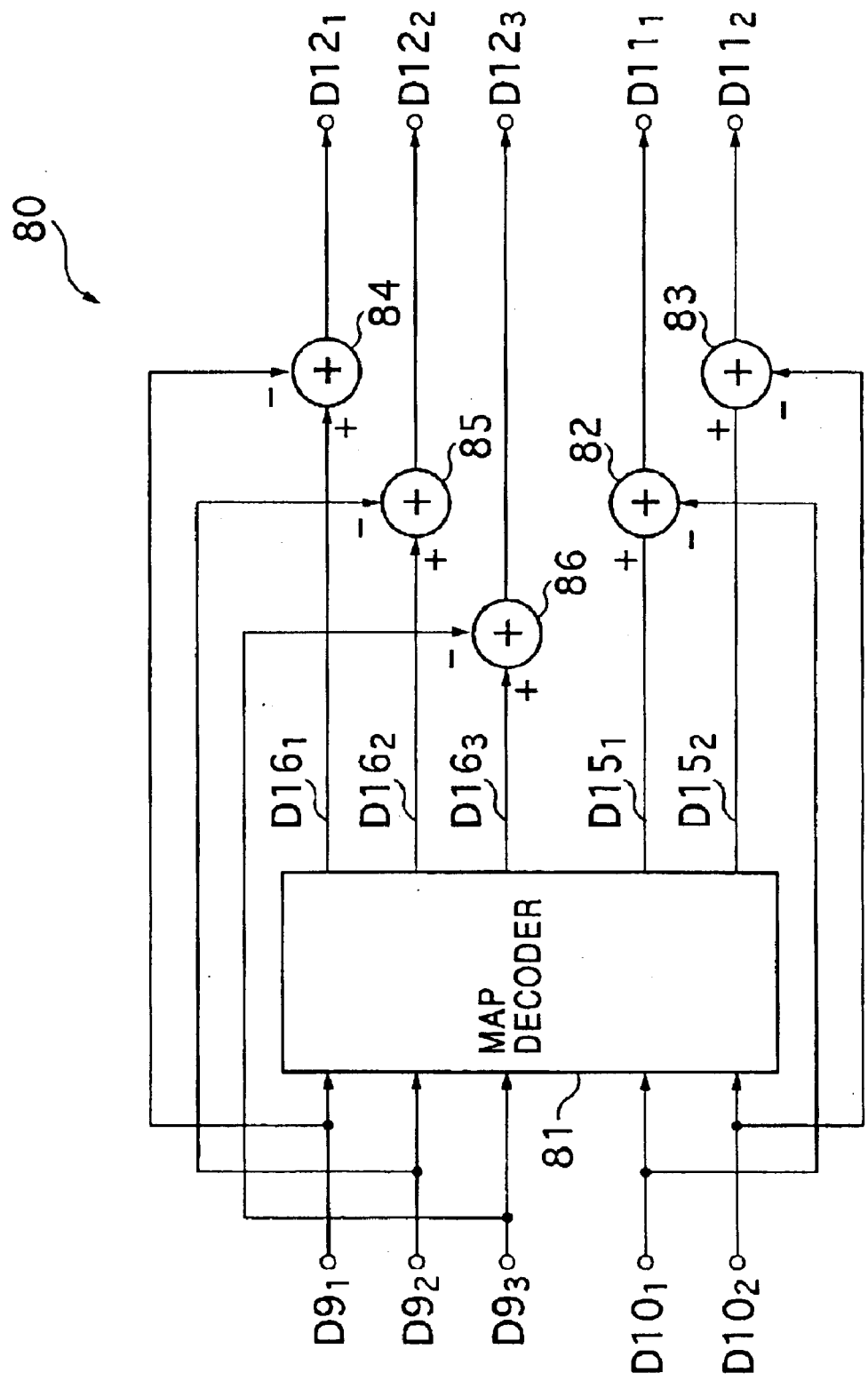
FIG. 6 is a block diagram of the configuration of a soft-output decoder circuit that is included in the decoding device shown in FIG. 4 and that performs soft-output decoding of an outer code.

The soft-output decoder circuit 80 is associated with the convolutional encoder 10 of the encoding device 1. Referring to FIG. 6, the soft-output decoder circuit 80 includes a MAP decoder 81 that performs MAP decoding based on the BCJR algorithm, Max-Log-BCJR algorithm, or Log-BCJR algorithm and five difference computing units 82, 83, 84, 85, and 86.

The MAP decoder 81 receives the soft-input a-priori probability information $D9_1$, $D9_2$, $D9_3$ that are output from the de-interleaver 60 and that correspond to the 3-bit encoded bits and a-priori probability information $D10_1$ and $D10_2$ that have a value of zero and that correspond to the 2-bit information bits, performs MAP decoding based on the BCJR algorithm, Max-Log-BCJR algorithm, or Log-BCJR algorithm, and generates a-posteriori probability information $D15_1$ and $D15_2$ corresponding to the 2-bit information bits and a-posteriori probability information $D16_1$, $D16_2$, and $D16_3$ corresponding to the 3-bit encoded bits. The MAP decoder 81 supplies the generated a-posteriori probability information $D15_1$ to the difference computing unit 82 and the generated a-posteriori probability information $D15_2$ to the difference computing unit 83. Also, the MAP decoder 81 supplies the generated a-posteriori probability information $D16_1$ to the difference computing unit 84, the generated a-posteriori probability information $D16_2$ to the difference computing unit 85, and the generated a-posteriori probability information $D16_3$ to the difference computing unit 86.

The difference computing unit 82 outputs the difference between the soft-input a-posteriori probability information $D15_1$ and the a-priori probability information $D10_1$ with a value of zero, that is, the a-posteriori probability information $D15_1$, as 1-bit extrinsic information $D11_1$ of extrinsic information D11 that is obtained in accordance with the code's constraint condition and that corresponds to the 2-bit information bits, i.e., outputs the a-posteriori probability information $D15_1$ as soft-output, to the binarization circuit 90 at a subsequent stage.

The difference computing unit 83 outputs the difference between the soft-input a-posteriori probability information $D15_2$ and the a-priori probability information $D10_2$ with a value of zero, that is, the a-posteriori probability information $D15_2$, as 1-bit extrinsic information $D11_2$ of the extrinsic information D11 that corresponds to the 2-bit information bits, i.e., outputs the a-posteriori probability information $D15_2$ as soft-output, to the binarization circuit 90 at the subsequent stage.

The difference computing unit 84 computes the difference between the soft-input a-posteriori probability information $D16_1$ and the soft-input a-priori probability information $D9_1$ and outputs the difference as 1-bit extrinsic information $D12_1$ of the extrinsic information D12 corresponding to the 3-bit encoded bits, i.e., outputs the difference as soft-output, to the interleaver 70.

The difference computing unit 85 computes the difference between the soft-input a-posteriori probability information $D16_2$ and the soft-input a-priori probability information $D9_2$ and outputs the difference as 1-bit extrinsic information $D12_2$ of the extrinsic information D12 corresponding to the 3-bit encoded bits, i.e., outputs the difference as soft-output, to the interleaver 70.

The difference computing unit 86 computes the difference between the soft-input a-posteriori probability information $D16_3$ and the soft-input a-priori probability information $D9_3$ and outputs the difference as 1-bit extrinsic information $D12_3$ of the extrinsic information D12 corresponding to the 3-bit encoded bits, i.e., outputs the difference as soft-output, to the interleaver 70.

The soft-output decoder circuit 80 described above receives the soft-input a-priori probability information D9 that is output from the de-interleaver 60 and that corresponds to the encoded bits and the a-priori probability information D10 that has a value of zero and that corresponds to the information bits, performs MAP decoding based on the BCJR algorithm, Max-Log-BCJR algorithm, or Log-BCJR algorithm using the a-priori probability information D9 and D10, and performs soft-output decoding of the outer code. The soft-output decoder circuit 80 generates the extrinsic information D11 and D12 obtained in accordance with the code's constraint condition and outputs the extrinsic information D11 as soft-output to the binarization circuit 90 at the subsequent stage and the extrinsic information D12 as soft-output to the de-interleaver 70.

More specifically, let u be an information bit and c be a coded bit. The soft-output decoder circuit 80 inputs, to the MAP decoder 81, the a-priori probability information D10 (L(u)) expressed by equation (11) and the a-priori probability information D9 (L(c)) expressed by equation (12):

$$L(u) = \frac{P(u=1)}{P(u=0)} \tag{11}$$

$$L(c) = \frac{P(c=1)}{P(c=0)} \tag{12}$$

In other words, the soft-output decoder circuit 80 inputs, to the MAP decoder 81, the a-priori probability information D10 (L(u)) that is based on the code's constraint condition and that is expressed in terms of a natural logarithm of the ratio of the probability of the information bit u being one P (u=1) to the probability of the information bit u being zero P (u=0) and the a-priori probability information D9 (L(c)) that is based on the code's constraint condition and that is expressed in terms of a natural logarithm of the ratio of the probability of the coded bit c being one P (c=1) to the probability of the coded bit c being zero P (c=0). The code's constraint condition, which should be written on the right-hand side of each of equations (11) and (12), is omitted. The a-priori probability information D10 (L(u)) has a value of zero, which means that the probability of the information bit u being zero or one is 1/2.

Subsequently, in the soft-output decoder circuit 80, the MAP decoder 81 performs MAP decoding based on the BCJR algorithm, Max-Log-BCJR algorithm, or Log-BCJR algorithm and generates the a-posteriori probability information D15 (L*(u)) expressed by equation (13) and the a-posteriori probability information D16 (L*(c)) expressed by equation (14):

$$L^*(u) = \frac{P(u=1)}{P(u=0)} \tag{13}$$

$$L^*(c) = \frac{P(c=1)}{P(c=0)} \tag{14}$$

In other words, in the soft-output decoder circuit 80, the MAP decoder 81 generates the a-posteriori probability information D15 (L*(u)) that is based on the code's constraint condition and that is expressed in terms of a natural logarithm of the ratio of the probability of the information bit u being one P (u=1) to the probability of the information bit u being zero P (u=0) and the a-posteriori probability information D16 (L*(c)) that is based on the code's constraint condition and that is expressed in terms of a natural logarithm of the ratio of the probability of the coded bit c being one P (c=1) to the probability of the coded bit c being zero P (c=0). The code's constraint condition, which should be written on the right-hand side of each of equations (13) and (14), is omitted. The a-posteriori probability information D15 (L*(u)) and the a-posteriori probability information D16 (L*(c)) are also referred to as the log likelihood ratios and indicate the likelihood of the information bit u and the likelihood of the coded bit c, respectively.

In the soft-output decoder circuit 80, the difference computing units 82 and 83 compute the extrinsic information D11 ($L_e(u)$), which is the difference between the a-posteriori probability information D15 (L*(u)) and the a-priori probability information D10 (L(u)), as expressed by equation (15). The difference computing units 84, 85, and 86 compute the extrinsic information D12 ($L_e(c)$), which is the difference between the a-posteriori probability information D16 (L*(c)) and the a-priori probability information D9 (L(c)), as expressed by equation (16):

$$L_e(u) = L^*(u) - L(u) \tag{15}$$

$$L_e(c) = L^*(c) - L(c) \tag{16}$$

Accordingly, the soft-output decoder circuit 80 generates the extrinsic information D11 and D12 and outputs the extrinsic information D11 as soft-output to the binarization circuit 90 at the subsequent stage and the extrinsic information D12 as soft-output to the interleaver 70.

Since the a-priori probability information D10 has a value of zero, the soft-output decoder circuit 80 does not necessarily have to include the differential computing units 82 and 83.

The binarization circuit 90 binarizes the a-posteriori probability information D15 generated by the soft-output decoder circuit 80 and outputs the binarized data as the hard-output encoded data D13.

Since the decoding device 3 described above includes the soft-output decoder circuits 50 and 80 being associated with the convolutional encoders 30 and 10, respectively, of the encoding device 1, the decoding device 3 decomposes a code with a high decoding complexity into small pieces with a low complexity. The mutual operation between the soft-output decoder circuits 50 and 80 leads to successive improvement in the characteristics. When the decoding device 3 receives the received value D6, the decoding device 3 iterates the decoding operation involving the circuits from the soft-output decoder circuit 50 to the soft-output decoder circuit 80 a predetermined number of times, such as a few times to several dozen times, and outputs the decoded data D13 on the basis of the soft-output a-posteriori probability information D15 that is obtained as a result of the decoding operation performed the predetermined number of times.

Guiding principles for improving the code performance will now be described.

A first guiding principle will now be described

A convolutional encoder with two memories does not terminate with an input distance of one, as in the case with a convolutional encoder with one memory. However, with an input distance of two, there is no guarantee that the convolutional encoder with two memories terminates, whereas the convolutional encoder with one memory always terminates with an input distance of two. With an input distance of two, the convolutional encoder with two memories may not terminate. With an input distance of three, there is no guarantee that the convolutional encoder with two memories does not terminate, whereas the convolutional encoder with one memory does not always terminate with an input distance of three. With an input distance of three, the convolutional encoder with two memories may terminate. In other words, the convolutional encoder with two memories may terminate with an odd-numbered input distance. With an input distance of three or less, the code performance may be degraded. This problem occurs not only with the convolutional encoder having two memories but also with an encoder having two or more memories, which is used to encode the inner code.

The first guiding principle is to use, as the outer code, "a code having a minimum output distance that is greater than the inner code's maximum input distance at which the minimum-distance inner code is generated" when an encoder with two or more memories is used to encode the inner code.

Specifically, a case is described in which a convolutional encoder that employs a generator matrix G(D) expressed by equation (17) is used as the above-described convolutional encoder 30. In other words, a case is described in which a convolutional encoder that employs a feedback polynomial expressed as a primitive quadratic polynomial $(1+D+D^2)$ is used to encode the inner code.

$$G(D) = \frac{1}{1+D+D^2} \begin{bmatrix} 1 & D+D^2 & D \\ D+D^2 & 1 & D \\ D^2 & D^2 & 1 \end{bmatrix} \quad (17)$$

Figure 7:
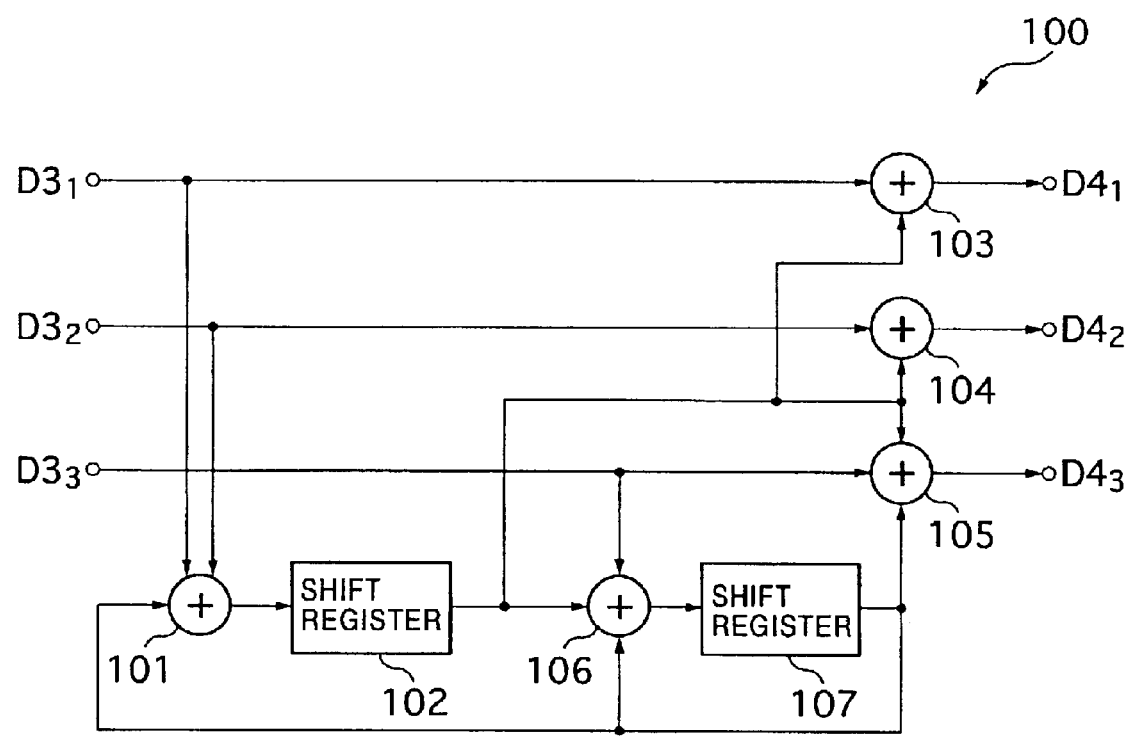
FIG. 7 is a block diagram of the configuration of a specific example of a convolutional encoder that is included in the encoding device shown in FIG. 2 and that encodes the inner code in a case in which a condition proposed as a first guiding principle is applied.

The convolutional encoder that employs the generator matrix G(D) expressed by equation (17) has the configuraiton shown in FIG. 7.

Specifically, a convolutional encoder 100 shown in FIG. 7 includes five exlusive OR circuits 101, 103, 104, 105, and 106 and two shift registers 102 and 107.

The exclusive OR circuit 101 computes the exclusive OR of data supplied from the shift register 107 and 2-bit interleaved data $D3_1$ and $D3_2$ output from the above-described interleaver 20 and supplies the computation result to the shift register 102.

The shift register 102 continuously supplies 1-bit data maintained therein to the exclusive OR circuits 103, 104, 105, and 106. In synchronization with a clock signal, the shift register 102 maintains new 1-bit data supplied from the exclusive OR circuit 101 and supplies the new data to the exclusive OR circuits 103, 104, 105, and 106.

The exclusive OR circuit 103 computes the exclusive OR of data supplied from the shift register 102 and the 1-bit interleaved data $D3_1$ output from the interleaver 20 and supplies the computation result as 1-bit encoded data $D4_1$ of the 3-bit encoded data D4 to the multi-level modulation mapping circuit 40 at the subsequent stage.

The exclusive OR circuit 104 computes the exclusive OR of data supplied from the shift register 102 and the 1-bit interleaved data $D3_2$ output from the interleaver 20 and supplies the computation result as 1-bit encoded data $D4_2$ of the 3-bit encoded data D4 to the multi-level modulation mapping circuit 40 at the subsequent stage.

The exclusive OR circuit 105 computes the exclusive OR of data supplied from the shift registers 102 and 107 and 1-bit interleaved data D33 output from the interleaver 20 and supplies the computation result as 1-bit encoded data $D4_3$ of the 3-bit encoded data D4 to the multi-level modulation mapping circuit 40 at the subsequent stage.

The exclusive OR circuit 106 computes the exclusive OR of data supplied from the shift registers 102 and 107 and the 1-bit interleaved data $D3_3$ output from the interleaver 20 and supplies the computation result to the shift register 107.

The shift register 107 continuously supplies 1-bit data maintained therein to the exclusive OR circuits 101, 105, and 106. In synchronization with a clock signal, the shift register 107 maintains new 1-bit data supplied from the exclusive OR circuit 106 and supplies the new data to the exclusive OR circuits 101, 105, and 106.

When the convolutional encoder 100 described above receives the 3-bit interleaved data $D3_1$, $D3_2$, and $D3_3$, the convolutional encoder 100 performs a convolutional operation of the interleaved data $D3_1$, $D3_2$, and $D3_3$ and outputs the operation result as the 3-bit encoded data $D4_1$, $D4_2$, and $D4_3$ to the multi-level modulation mapping circuit 40 at the subsequent stage. In other words, the convolutional encoder 100 performs a convolutional operation to encode the inner code with a code rate of 3/3=1 and outputs the encoded data D4 to the multi-level modulation mapping circuit 40 at the subsequent stage.

Figure 8:
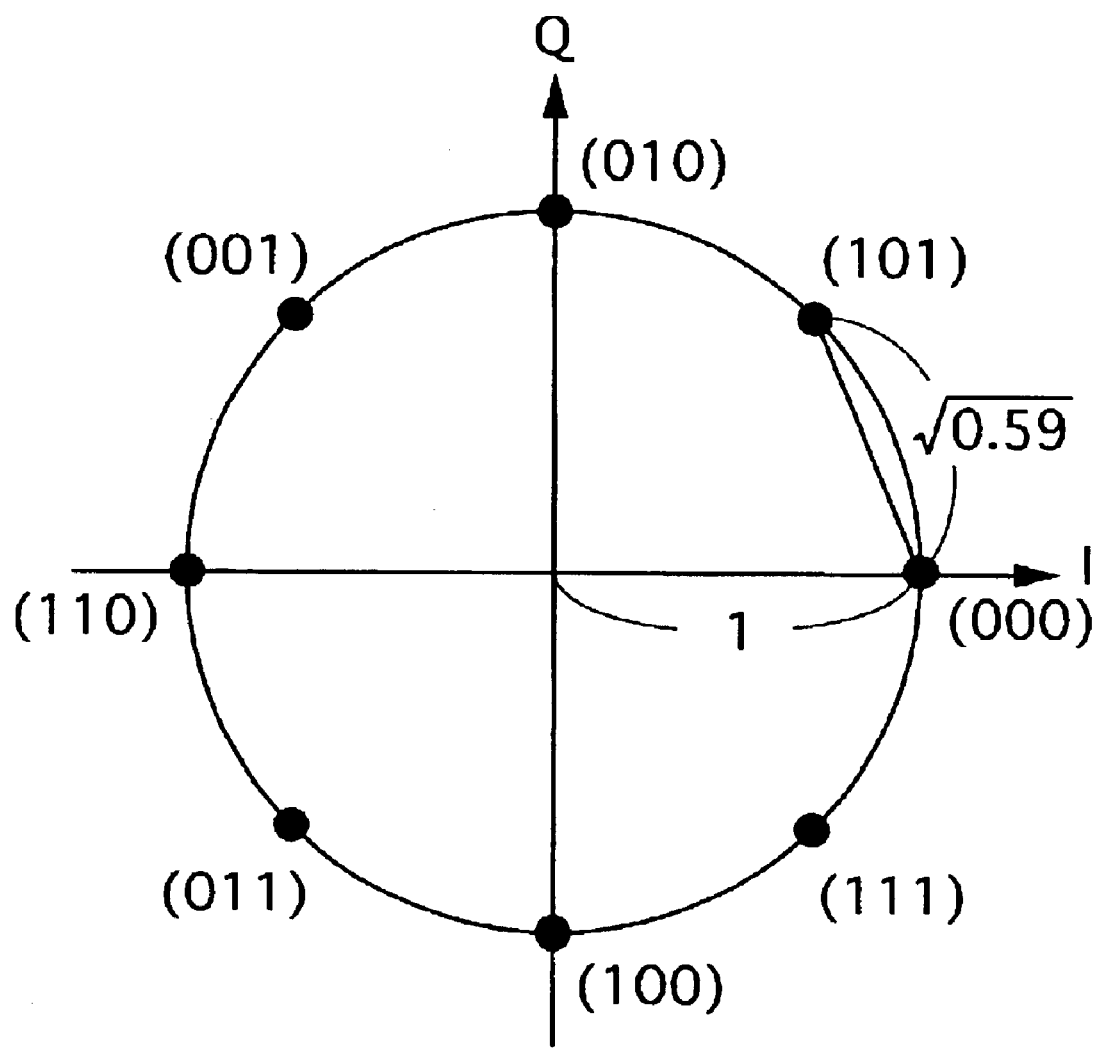
FIG. 8 is a diagram of a signal constellation based on 8PSK performed by a multi-level modulation mapping circuit included in the encoding device shown in FIG. 2, illustrating an output distance of the convolutional encoder shown in FIG. 7.

The encoded data D4 generated by the convolutional encoder 100 described above is mapped by the multi-level modulation mapping circuit 40 to signal points as shown in FIG. 8. Referring to FIG. 8, the output values assigned to each signal point are the 3-bit encoded data $D4_1$, $D4_2$, and $D4_3$ output from the convolutional encoder 100 shown in FIG. 7, which are expressed in the order ($D4_1$, $D4_2$, $D4_3$).

Figure 9:
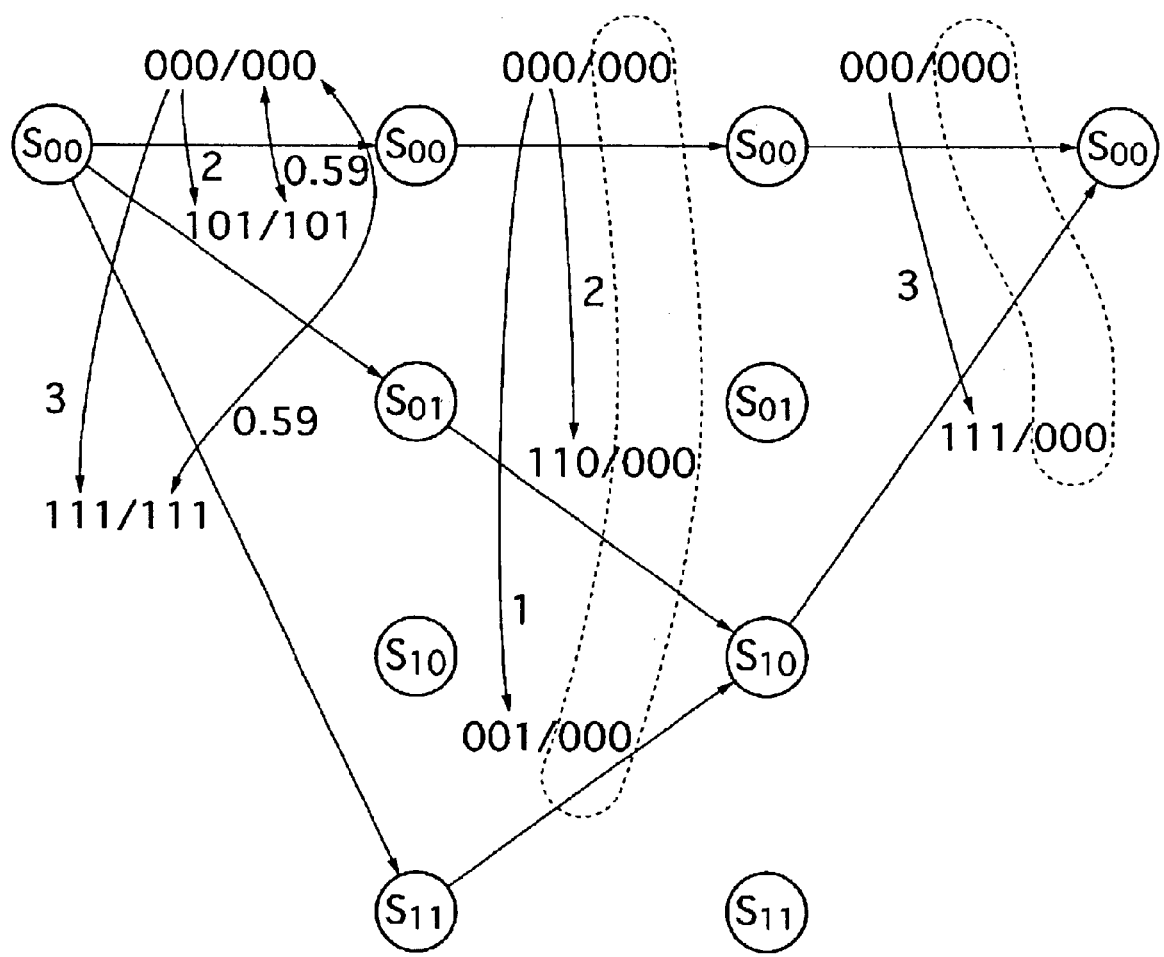
FIG. 9 is a trellis diagram in a case in which the encoding is performed by the convolutional encoder shown in FIG. 7 and the signal point mapping shown in FIG. 8 is performed.

When the encoding of the inner code is performed by the convolutional encoder 100 and the signal point mapping is performed by the multi-level modulation mapping circuit 40, a trellis as shown in FIG. 9 is obtained. Referring to FIG. 9, the trellis uses $S_{00}$ to represent states when the contents of the shift registers 102 and 107 of the convolutional encoder 100 are 00; $S_{01}$ to represent states when the contents of the shift registers 102 and 107 are 01; $S_{10}$ to represent states when the contents of the shift registers 102 and 107 are 10; and $S_{11}$ to represent states when the contents of the shift registers 102 and 107 are 11. Also, the trellis uses (D3$_1$, D3$_2$, D3$_3$)/(D4$_1$, D4$_2$, D4$_3$) to represent the input/output label attached to each path.

Specifically, the input distance between a path that has the input/output label 000/000 and that extends from state S$_{00}$ to state S$_{00}$ and a path that has the input/output label 101/101 and that extends from state S$_{00}$ to state S$_{01}$ is 2, and the squared output distance therebetween is 0.59, which is computed on the basis of the signal point assignment shown in FIG. 8. The input distance between a path that has the input/output label 000/000 and that extends from state S$_{00}$ to state S$_{00}$ and a path that has the input/output label 111/111 and that extends from state S$_{00}$ to state S$_{11}$ is 3, and the squared output distance therebetween is 0.59, which is computed on the basis of the signal point assignment shown in FIG. 8. The input distance between a path that has the input/output label 000/000 and that extends from state S$_{00}$ to state S$_{00}$ and a path that has the input/output label 110/000 and that extends from state S$_{01}$ to state S$_{10}$ is 2, and the squared output distance therebetween is 0. The input distance between a path that has the input/output label 000/000 and that extends from state S$_{00}$ to state S$_{00}$ and a path that has the input/output label 001/000 and that extends from state S$_{11}$ to state S$_{10}$ is 1, and the squared output distance therebetween is 0. The input distance between a path that has the input/output label 000/000 and that extends from state S$_{00}$ to state S$_{00}$ and a path that has the input/output label 111/000 and that extends from state S$_{10}$ to state S$_{00}$ is 3, and the squared output distance therebetween is 0.

As is clear from the trellis, the minimum distance of the code is obtained by following two paths indicated by broken lines in FIG. 9. Note that the two paths each have an input distance of 7.

In the case in which the convolutional encoder 100 shown in FIG. 7 is used to encode the inner code, the minimum distance of the entire concatenated code is made greater than the minimum distance of the inner code by using, as the outer code, a code having a minimum distance of eight or greater, which is greater than an input distance of seven. In the encoding device 1, an encoder that generates a code satisfying this condition should be provided as the above-described convolutional encoder 10.

As discussed above, in the encoding device 1, when the encoder that employs the feedback polynomial expressed as the primitive polynomial and that uses two or more memories is used to encode the inner code, generation of patterns that redundantly terminate is prevented by using, as the outer code, a code with the minimum output distance greater than the maximum input distance at which the minimum-distance inner code is generated. When the code performance is represented in terms of the relationship between the bit error rate and the signal-to-noise power ratio per bit (E$_b$/N$_o$), the bit error rate with a high signal-to-noise power ratio is improved.

A second guiding principle differing from the first one will now be described.

The above-described first guiding principle is proposed to prevent the possibility of an encoder with two or more memories, which is used to encode the inner code, terminating with an odd-numbered input distance. In contrast, the second guiding principle is proposed, for a case in which an encoder with two or more memories is used to encode the inner code, to "use an inner code that is not terminated with an odd-numbered input distance".

Specifically, a case is described in which a convolutional encoder that employs a generator matrix G(D) expressed by equation (18) is used as the above-described convolutional encoder 30. In other words, a case is described in which a convolutional encoder that employs a feedback polynomial expressed not as the primitive quadratic polynomial (equation (17)) but expressed as (1+D$^2$):

$$G(D) = \frac{1}{1+D^2} \begin{bmatrix} 1+D^2 & D^2 & 1 \\ 0 & 1+D+D^2 & D \\ 0 & D^2 & 1 \end{bmatrix} \quad (18)$$

Figure 10:
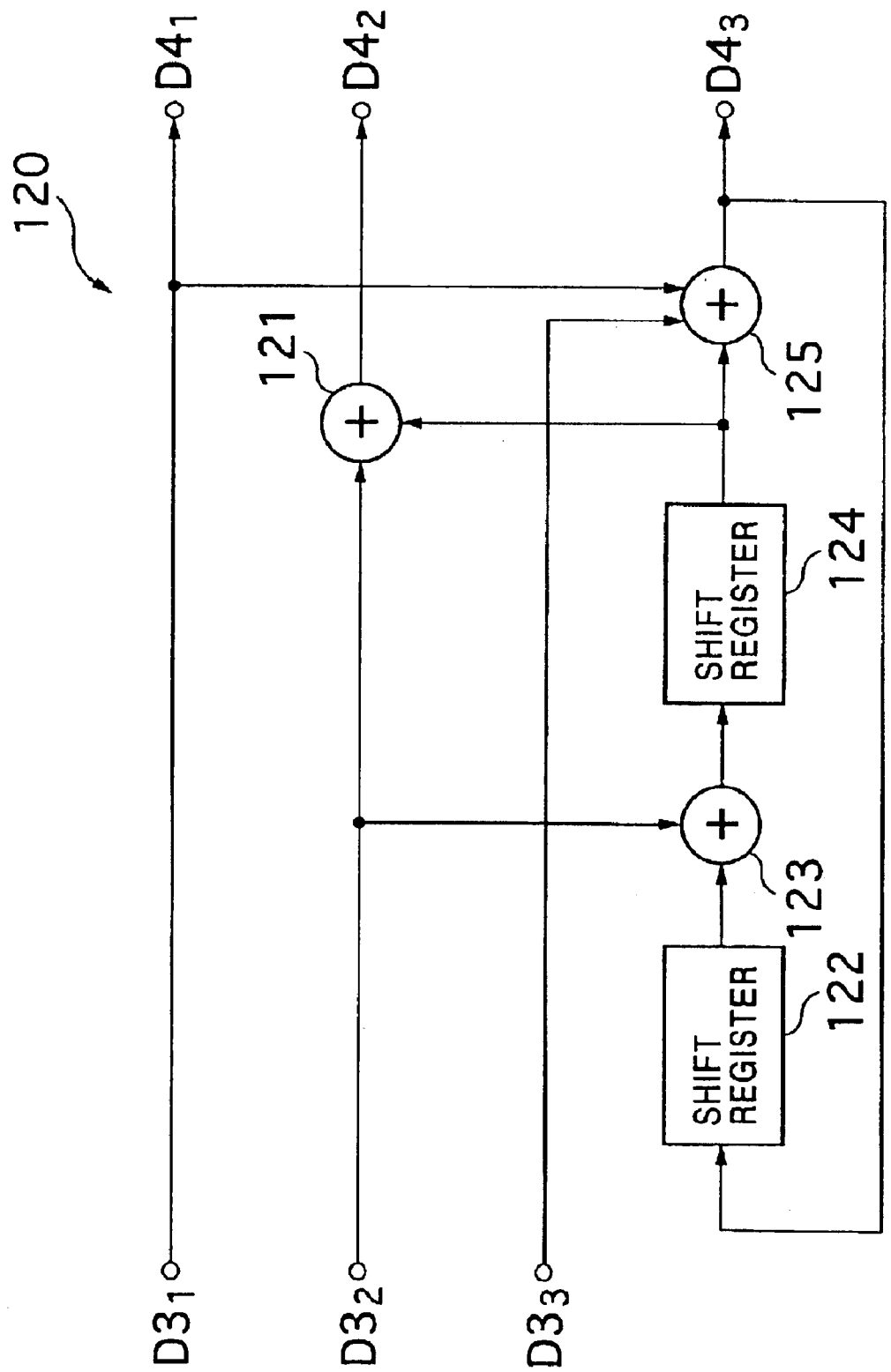
FIG. 10 is a block diagram of the configuration of a specific example of a convolutional encoder that is included in the encoding device shown in FIG. 2 and that encodes the inner code in a case in which a condition proposed as a second guiding principle is applied.

The convolutional encoder that employs the generator matrix G(D) expressed by equation (18) has the configuraiton shown in FIG. 10.

Specifically, a convolutional encoder 120 shown in FIG. 10 includes three exlusive OR circuits 121, 123, and 125 and two shift registers 122 and 124.

The exclusive OR circuit 121 computes the exclusive OR of data supplied from the shift register 124 and the 1-bit interleaved data D3$_2$ output from the above-described interleaver 20 and supplies the computation result as the 1-bit encoded data D4$_2$ of the 3-bit encoded data D4 to the multi-level modulation mapping circuit 40 at the subsequent stage.

The shift register 122 continuously supplies 1-bit data maintained therein to the exclusive OR circuit 123. In synchronization with a clock signal, the shift register 122 maintains new 1-bit data supplied from the exclusive OR circuit 125 and supplies the new data to the exclusive OR circuit 123.

The exclusive OR circuit 123 computes the exclusive OR of data supplied from the shift register 122 and the 1-bit interleaved data D3$_2$ output from the interleaver 20 and supplies the computation result to the shift register 124.

The shift register 124 continuously supplies 1-bit data maintained therein to the exclusive OR circuits 121 and 125. In synchronization with a clock signal, the shift register 124 maintains new 1-bit data supplied from the exclusive OR circuit 123 and supplies the new data to the exclusive OR circuits 121 and 125.

The exclusive OR circuit 125 computes the exclusive OR of data supplied from the shift register 124 and the 2-bit interleaved data D3$_1$ and D3$_3$ output from the interleaver 20 and supplies the computation result as the 1-bit encoded data D4$_3$ of the 3-bit encoded data D4 to the shift register 122.

When the convolutional encoder 120 described above receives the 3-bit interleaved data D3$_1$, D3$_2$, and D3$_3$, the convolutional encoder 100 outputs the 1-bit interleaved data D3$_1$ serving as the system-component encoded data D4$_1$ to the multi-level modulation mapping circuit 40 at the subsequent stage. At the same time, the convolutional encoder 120 performs a convolutional operation of the interleaved data D3$_1$, D3$_2$, and D3$_3$ and outputs the operation result as the remaining 2-bit encoded data D4$_2$ and D4$_3$ to the multi-level modulation mapping circuit 40 at the subsequent stage. In other words, the convolutional encoder 120 performs a convolutional operation to encode the inner code with a code rate of 3/3=1 and outputs the generated encoded data D4 to the multi-level modulation mapping circuit 40 at the subsequent stage.

Figure 11:
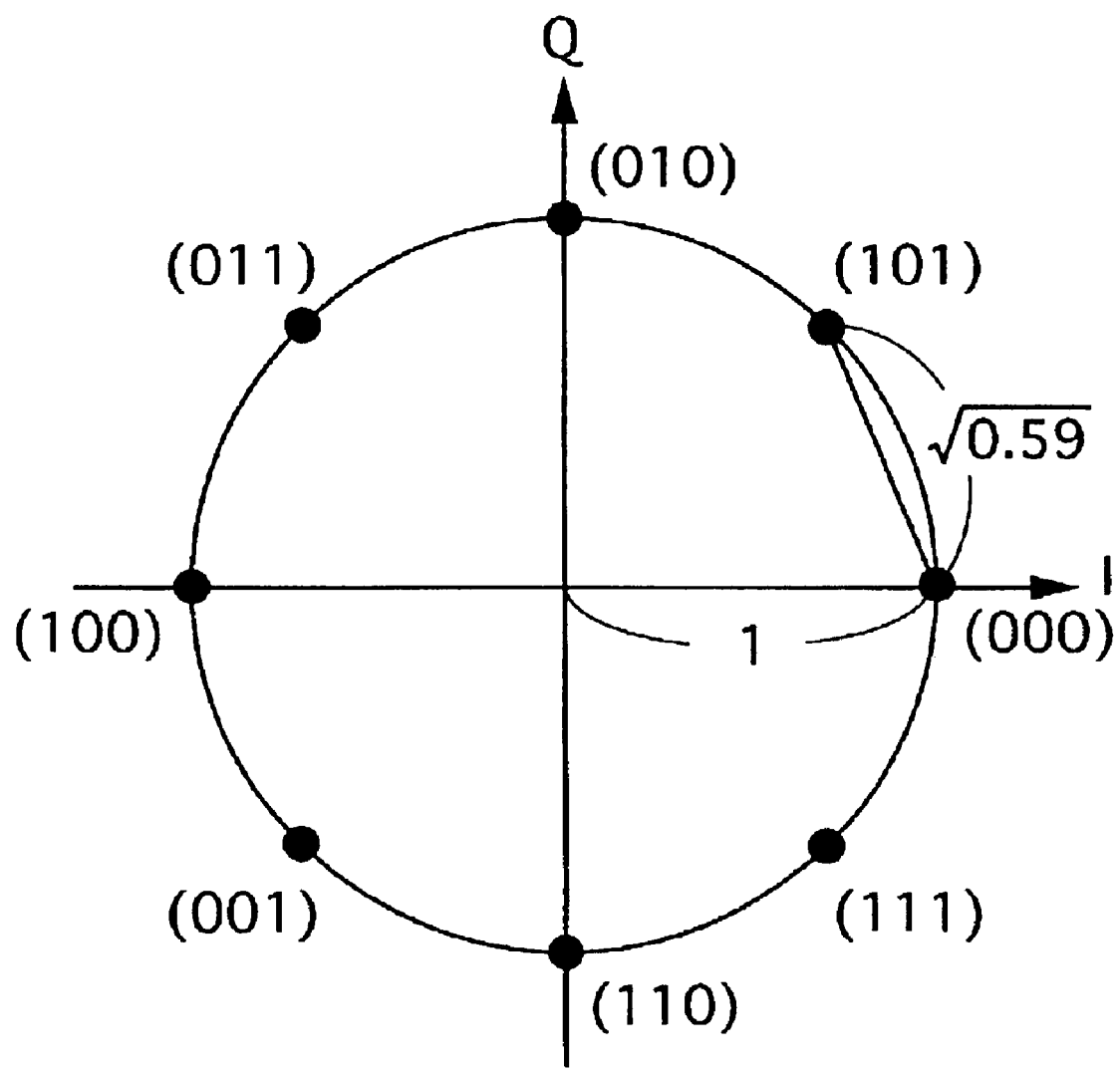
FIG. 11 is a diagram of a signal constellation based on 8PSK performed by the multi-level modulation mapping circuit included in the encoding device shown in FIG. 2, illustrating an output distance of the convolutional encoder shown in FIG. 10.

The encoded data D4 generated by the convolutional encoder 120 described above is mapped by the multi-level modulation mapping circuit 40 to signal points as shown in FIG. 11. Referring to FIG. 11, as in the case with FIG. 8, the output values assigned to each signal point are the 3-bit encoded data D4$_1$, D4$_2$, and D4$_3$ output from the convolutional encoder 120 shown in FIG. 10, which are expressed in the order (D4$_1$, D4$_2$, D4$_3$).

In a case in which the encoding of the inner code is performed by the convolutional encoder 120 and the signal point mapping is performed by the multi-level modulation mapping circuit 40, when an outer code with an odd-numbered minimum distance, that is, a minimum distance expressed as (2n+1) where n is an integer greater than or equal to 1, is used, a codeword that constitutes a concatenated code with a small distance is generated only when the output distance of the outer code is greater than the minimum distance by one.

In the encoding device 1, when the encoder that encodes the inner code employs the feedback polynomial expressed as $(1+D^n)$ and that generates a code that is not terminated with an odd-numbered input distance is used, performance equivalent to that of the first guiding principle is achieved without using, as the outer code, a code with the minimum output distance greater than the maximum input distance at which the minimum-distance inner code is generated.

In general, the minimum distance of a convolutional code with the same code rate is increased by increasing the number of memories. In contrast, in the encoding device 1, the encoder satisfying a condition proposed as the second guiding principle is used. This eliminates the necessity of increasing the number of memories in order to increase the minimum distance. Therefore, the bit error rate with a high signal-to-noise power ratio is improved while the decoding cost is suppressed.

As described above, the encoding device 1 of the data transmission/reception system according to the embodiment of the present invention improves, in a case in which an encoder with two or more memories is used to encode the inner code, the bit error rate with a high signal-to-noise power ratio by using, as the outer code, a code with the minimum output distance greater than the maximum input distance at which the minimum-distance inner code is generated.

Instead of using, as the outer code, a code with the minimum output distance greater than the maximum input distance at which the minimum-distance inner code is generated, the encoding device 1 improves the bit error rate with a high signal-to-noise power ratio while suppressing the decoding cost at a small circuit size by using, as the inner code, a code that is not terminated with an odd-numbered input distance, with the feedback polynomial being $(1+D^n)$.

The decoding device 3 can decode with high accuracy a code encoded by the encoding device 1 described above.

The data transmission/reception system thus improves the code performance and provides the user with excellent convenience and reliability.

The present invention is not limited to the above-described embodiment. For example, in the above-described embodiment, SCTCM coding is performed by the encoding device 1. The present invention is also applicable to SCCC decoding. In this case, instead of performing multi-level modulation mapping to realize an 8PSK signal point mapping, the encoding device performs, for example, binary phase shift keying (BPSK) or quadrature phase shift keying (QPSK).

In the above-described embodiment, the convolutional encoders 100 and 120 shown in FIGS. 7 and 10, respectively, are provided as specific examples of the convolutional encoder 30 for encoding the inner code, The present invention may use an arbitrary type of encoder without departing from the above-described discussion. Needless to say, the present invention performs signal point mapping in accordance with the inner code. Also, the present invention is applicable to an arbitrary code rate.

In the above-described embodiment, the soft-output decoder circuits in the decoding device perform MAP decoding based on the BCJR algorithm, Max-Log-BCJR algorithm, or Log-BCJR algorithm. The present invention is also applicable to other types of soft-output decoding, such as the so-called SOVA decoding.

In the above-described embodiment, the encoding device and the decoding device are applied to the transmitter and the receiver in the data transmission/reception system. The present invention is also applicable to a reading and/or writing device that reads and/or writes information from/to a recording medium such as a magnetic, optical, or magneto-optical disk, e.g., a floppy (registered trademark) disk, CD-ROM, or MO (magneto-optical) disk. In this case, data encoded by the encoding device is written in the recording medium equivalent to the memoryless channel, and the encoded data is decoded and read by the decoding device.

In the above-described embodiment, both the encoding device and the decoding device consist of hardware. However, the encoding device and the decoding device can be implemented as software executable on a computer device, such as a workstation or a personal computer. Hereinafter the latter case will be described with reference to FIG. 12.

Figure 12:
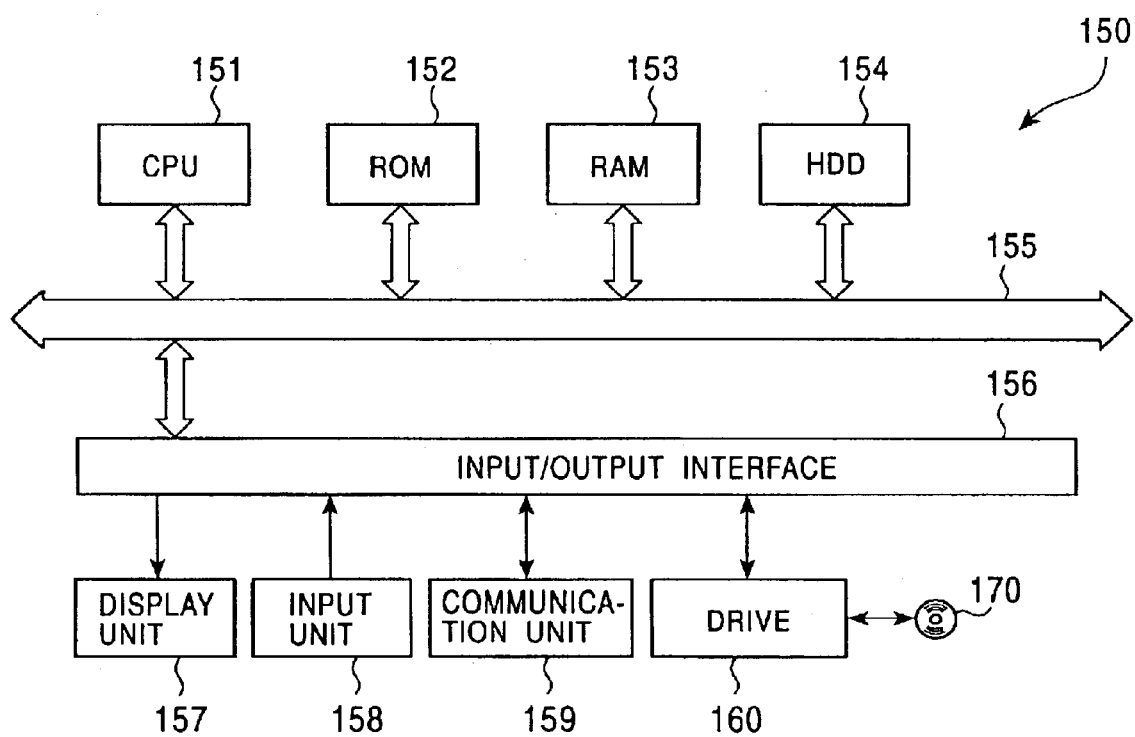
FIG. 12 is a block diagram of the configuration of a computer device.
Figure 13:
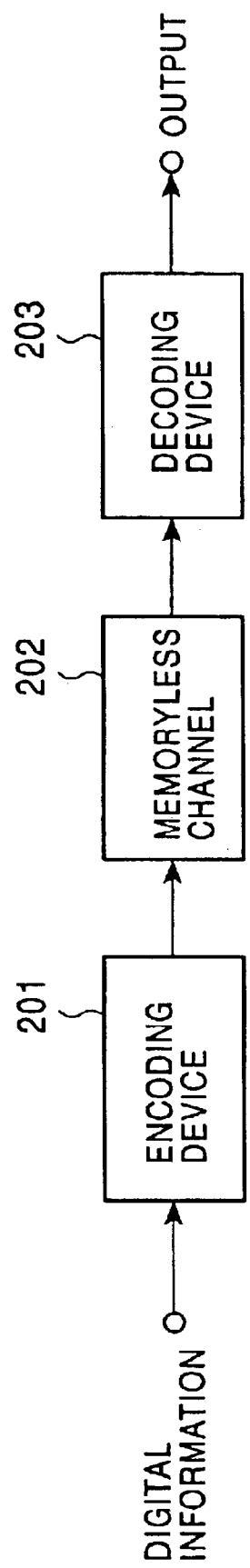
FIG. 13 is a block diagram of the configuration of the communication model.
Figure 14:
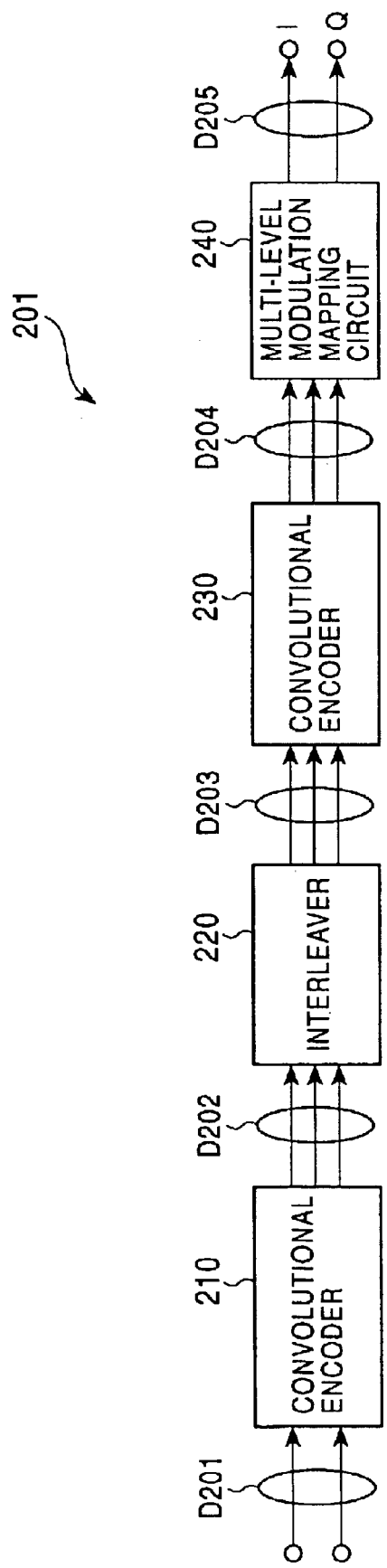
FIG. 14 is a block diagram of the configuration of a known encoding device.
Figure 15:
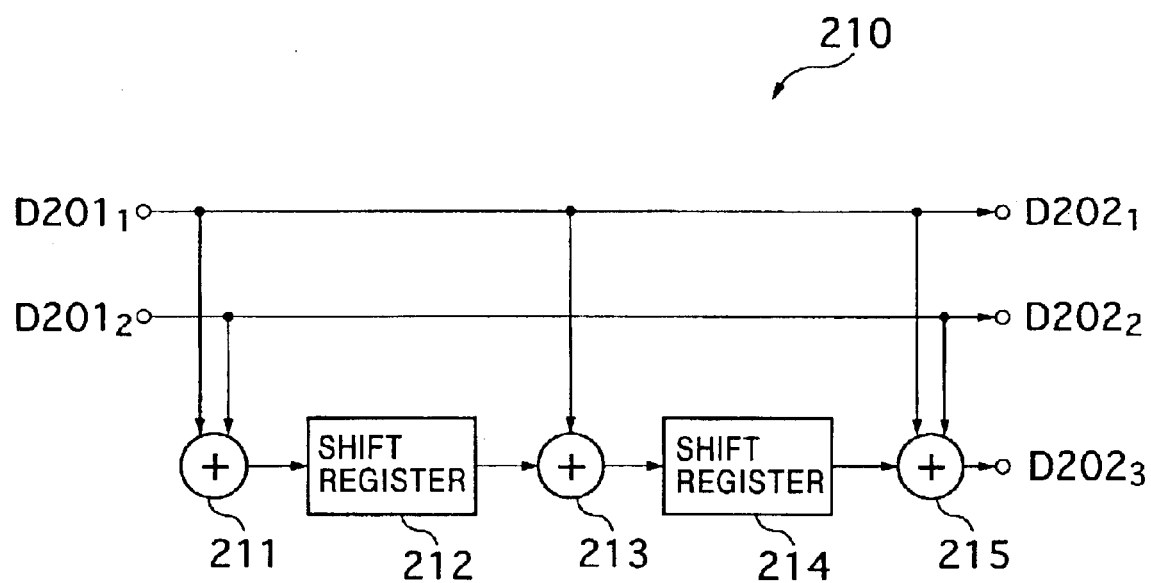
FIG. 15 is a block diagram of the configuration of a convolutional encoder that is included in the encoding device shown in FIG. 14 and that encodes an outer code.
Figure 16:
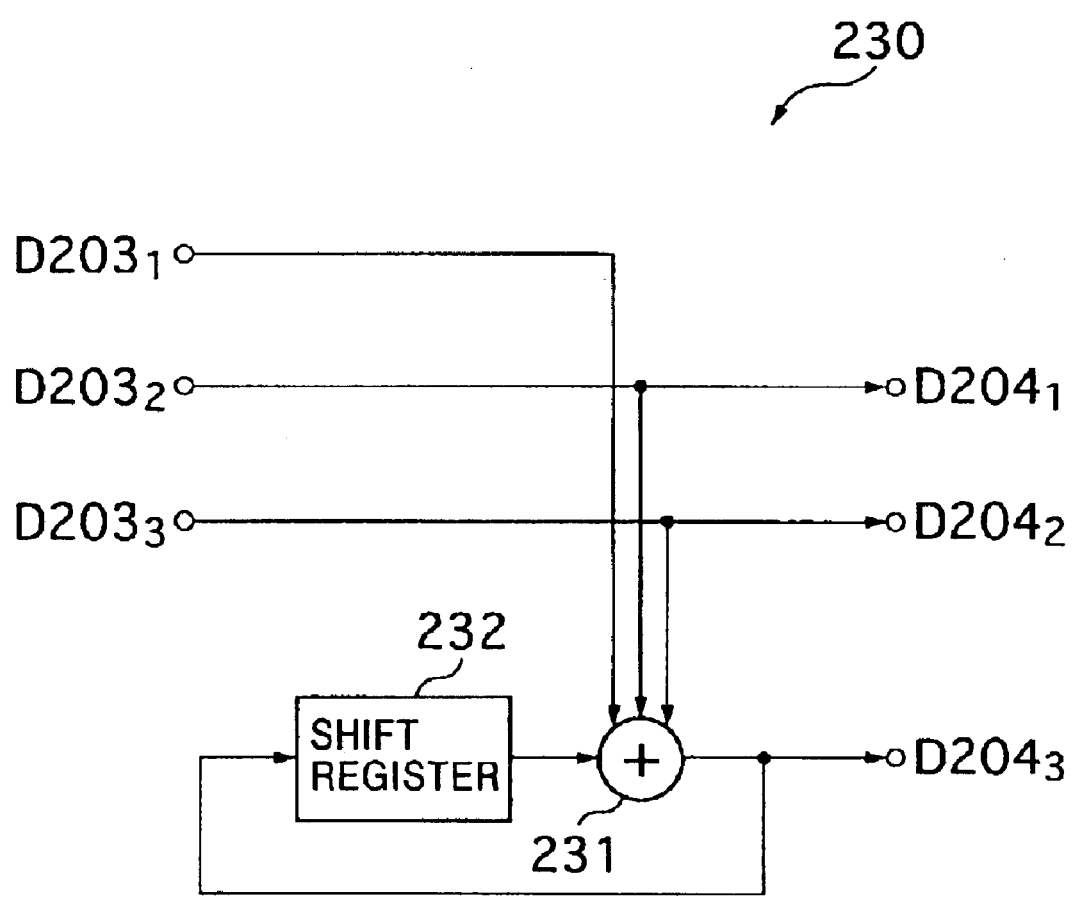
FIG. 16 is a block diagram of the configuration of a convolutional encoder that is included in the encoding device shown in FIG. 14 and that encodes an inner code.
Figure 17:
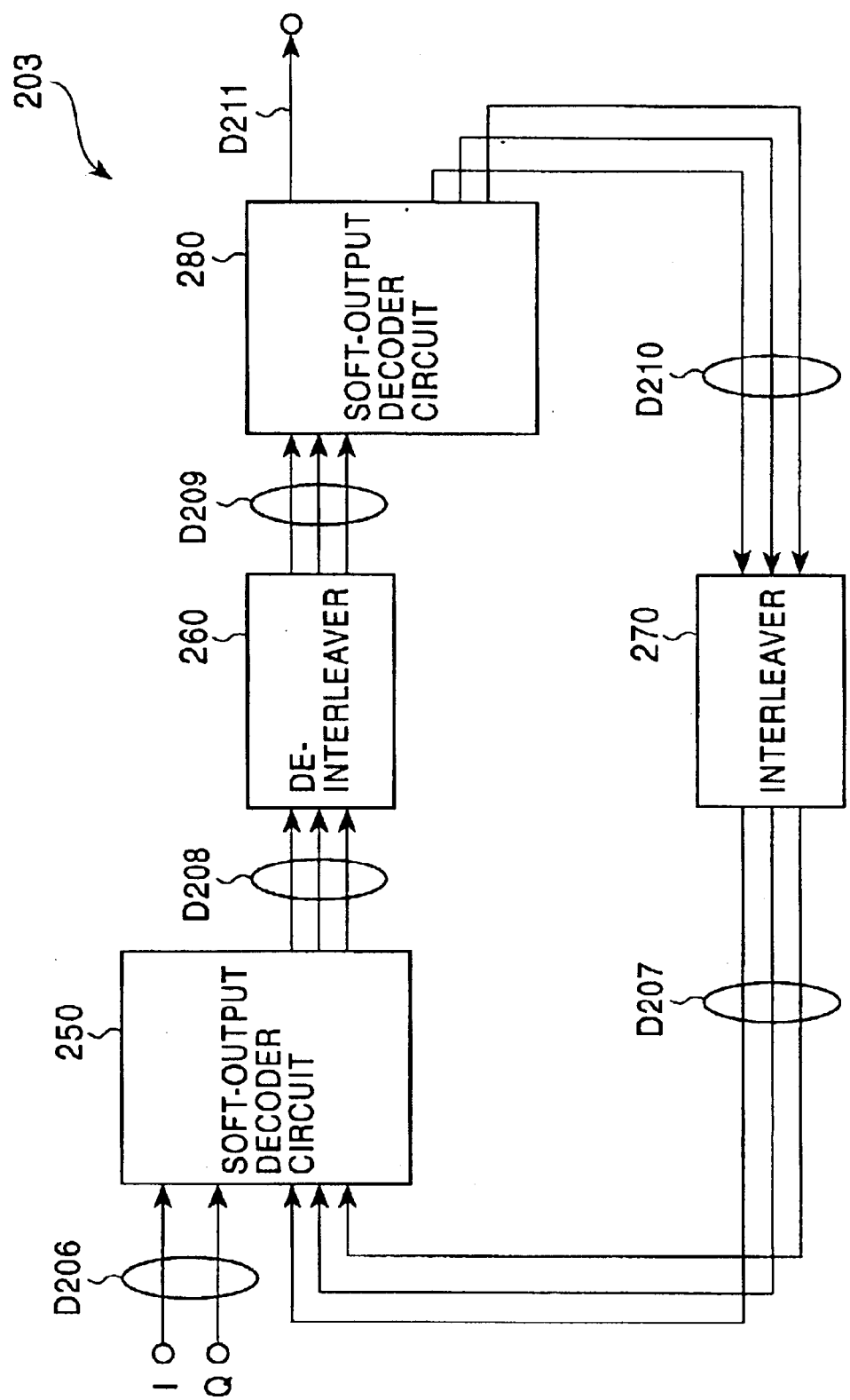
FIG. 17 is a block diagram of the configuration of a known decoding device.
Figure 18:
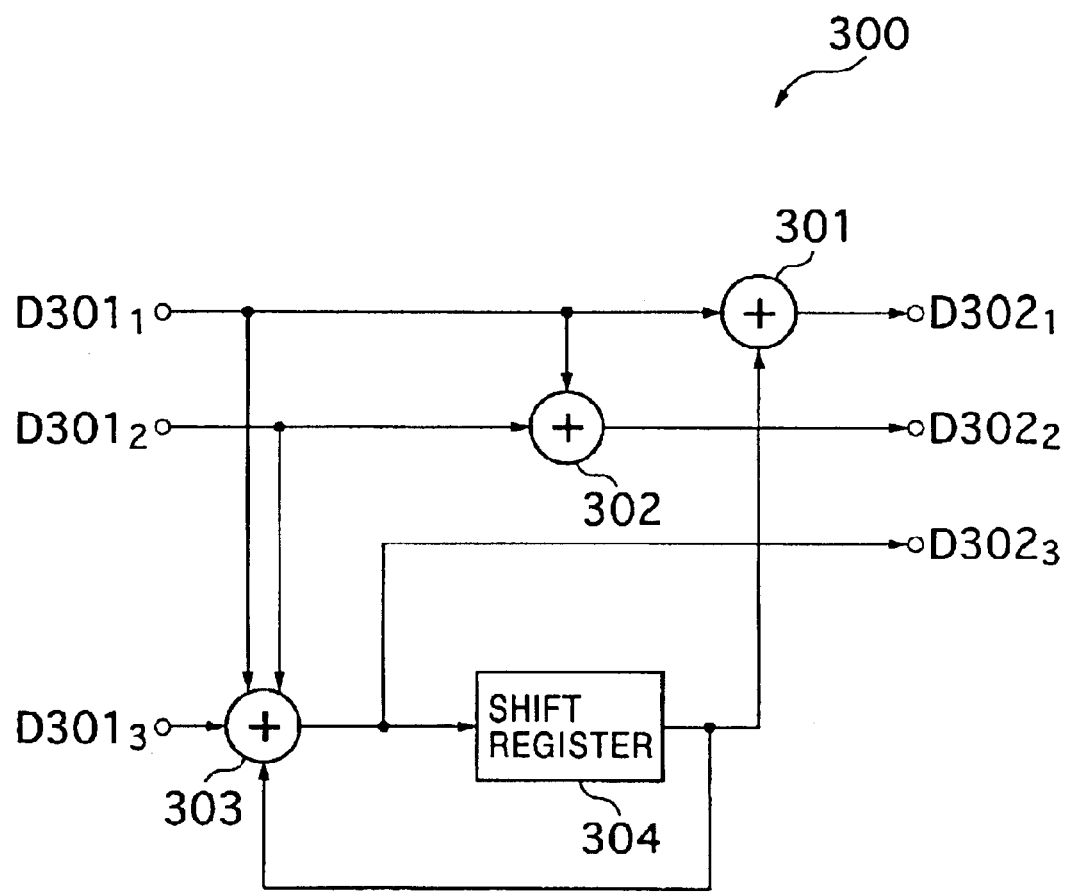
FIG. 18 is a block diagram of the configuration of a convolutional encoder that is described in the paper by Divsalar, et al. and that encodes an inner code.
Figure 19:
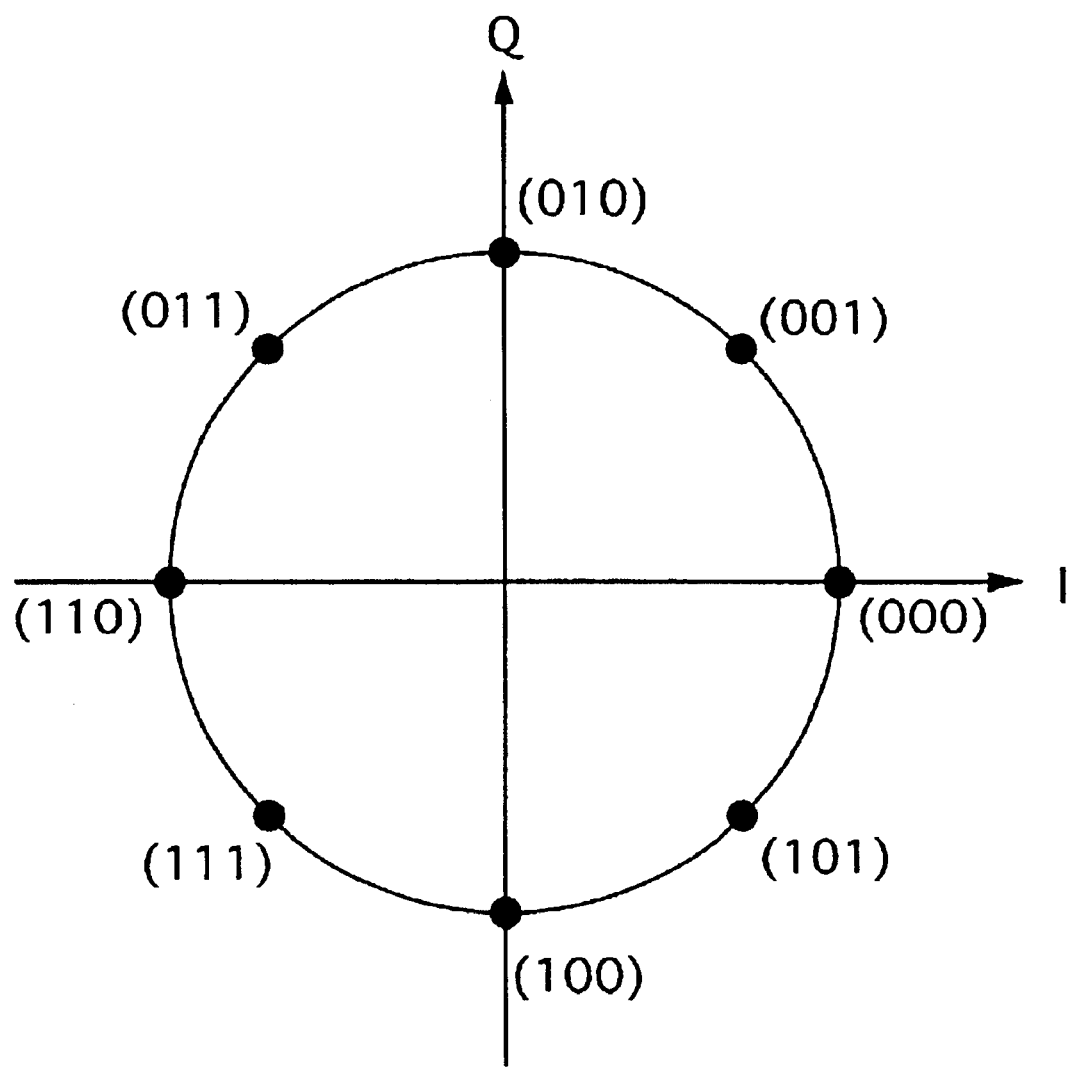
FIG. 19 is a diagram of a signal constellation based on 8PSK, which is described in the paper by Divsalar, et al.
Figure 20:
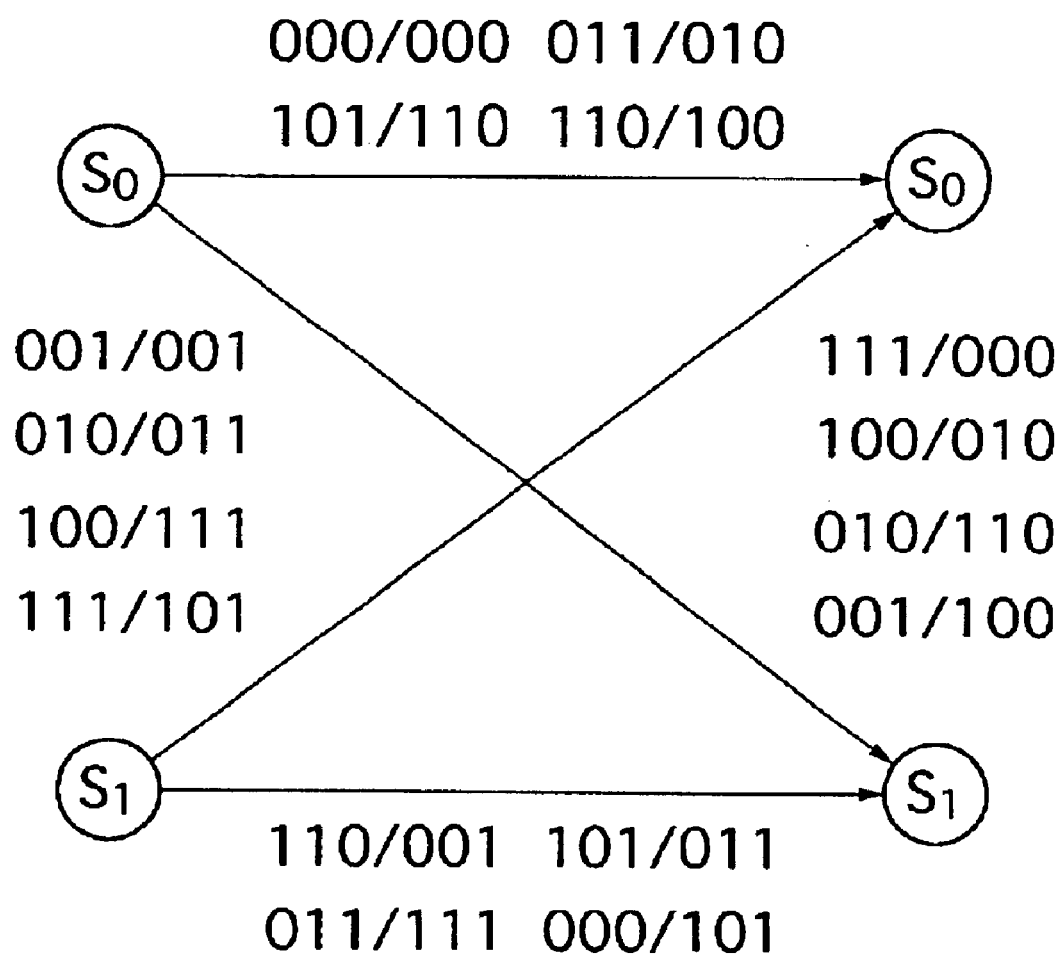
FIG. 20 is an entire trellis diagram corresponding to the signal constellation shown in FIG. 19 when the convolutional encoder shown in FIG. 18 is used.
Figure 21C:
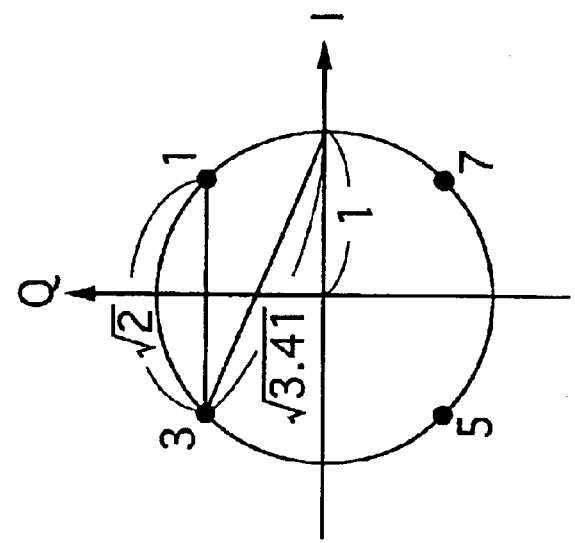
FIGS. 21A to 21C are diagrams of a signal constellation based on 8PSK, that is.
Figure 21B:
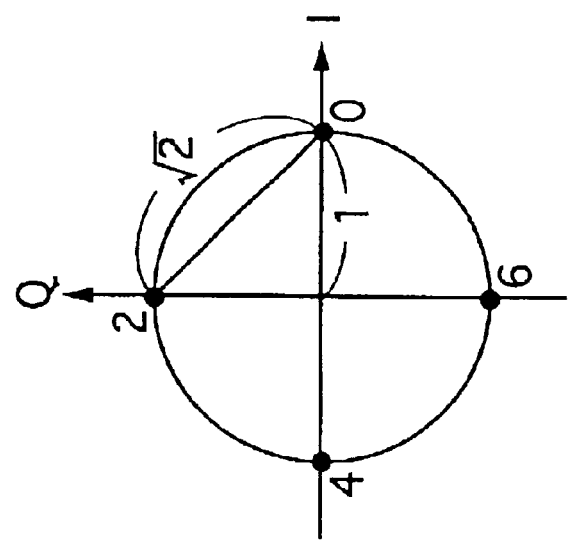
Figure 21A:
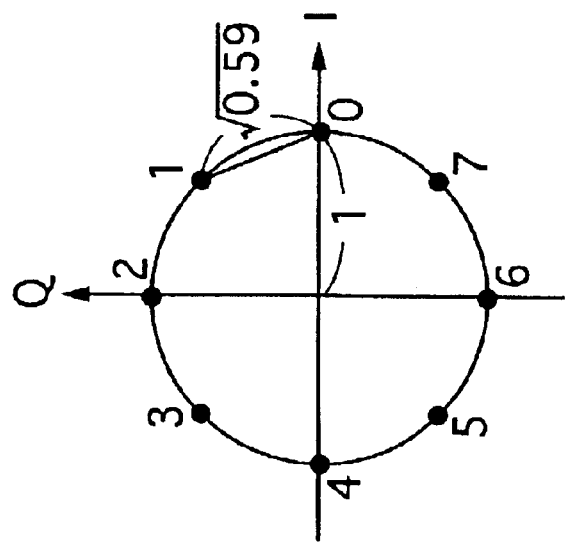
Figure 22:
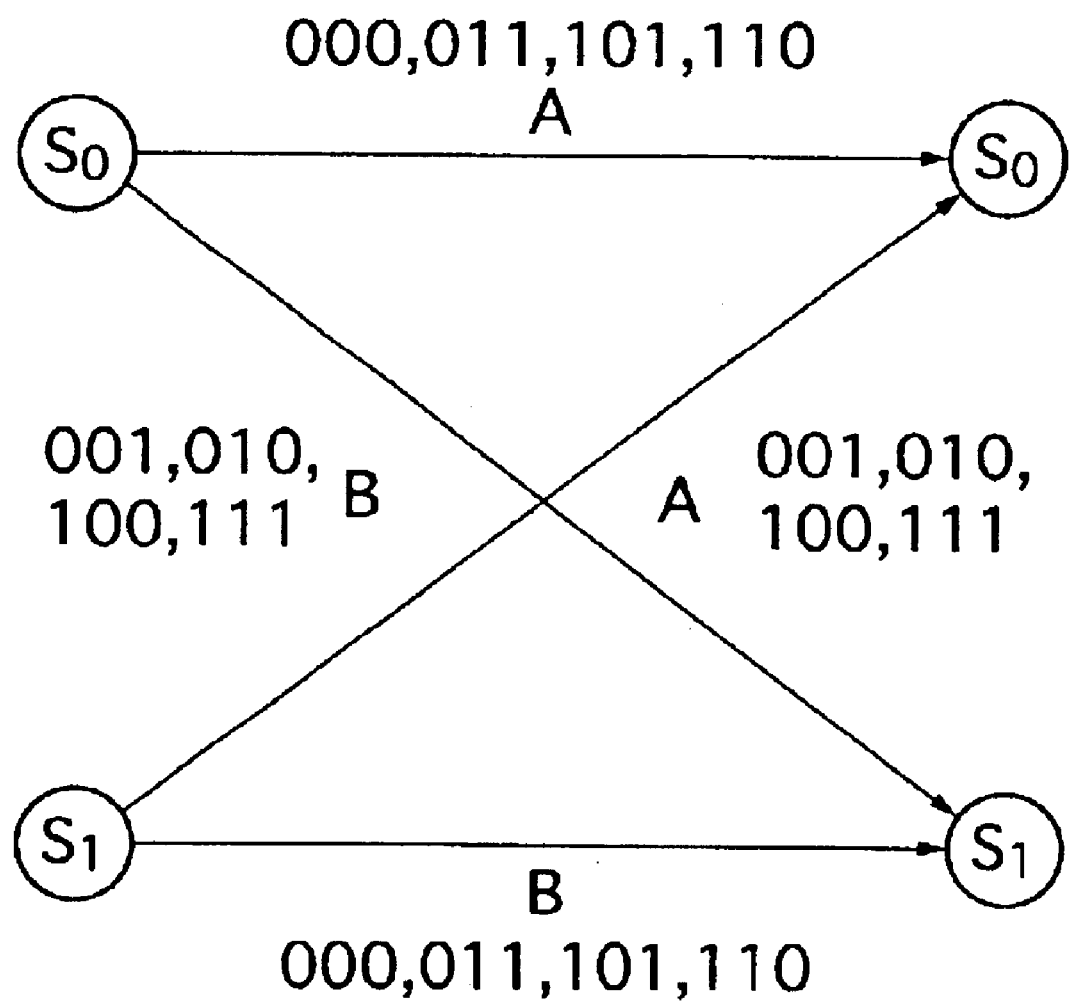
FIG. 22 is an entire trellis diagram in a case in which the signal points are assigned to the set A or set B so that an input Hamming distance between parallel paths is two.
Figure 23:
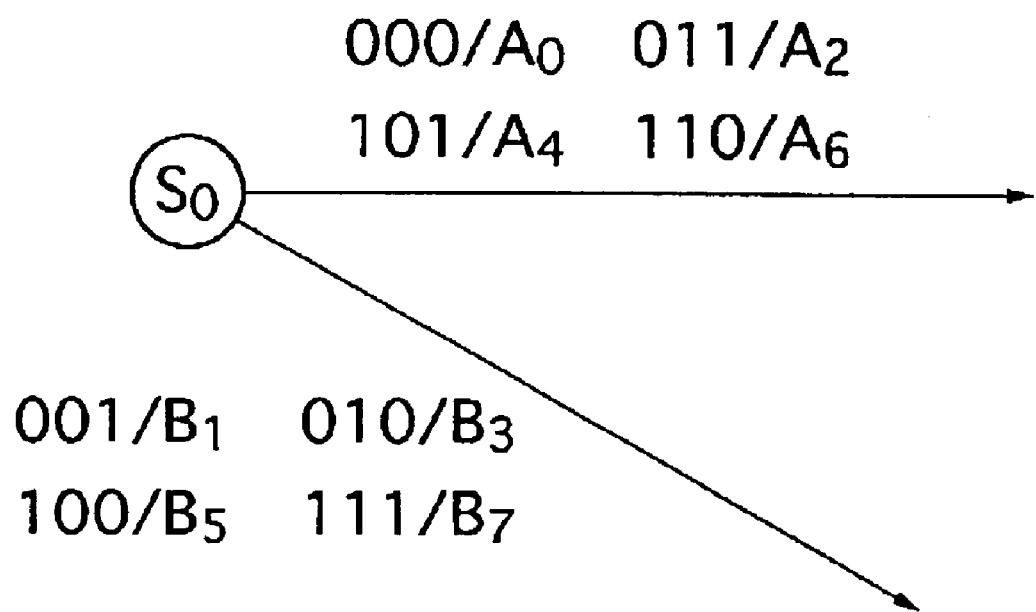
FIG. 23 is a partial trellis diagram corresponding to the signal constellation shown in FIG. 21, illustrating paths extending from state $S_0$ to state $S_0$ and paths extending from state $S_0$ to state $S_1$.
Figure 24:
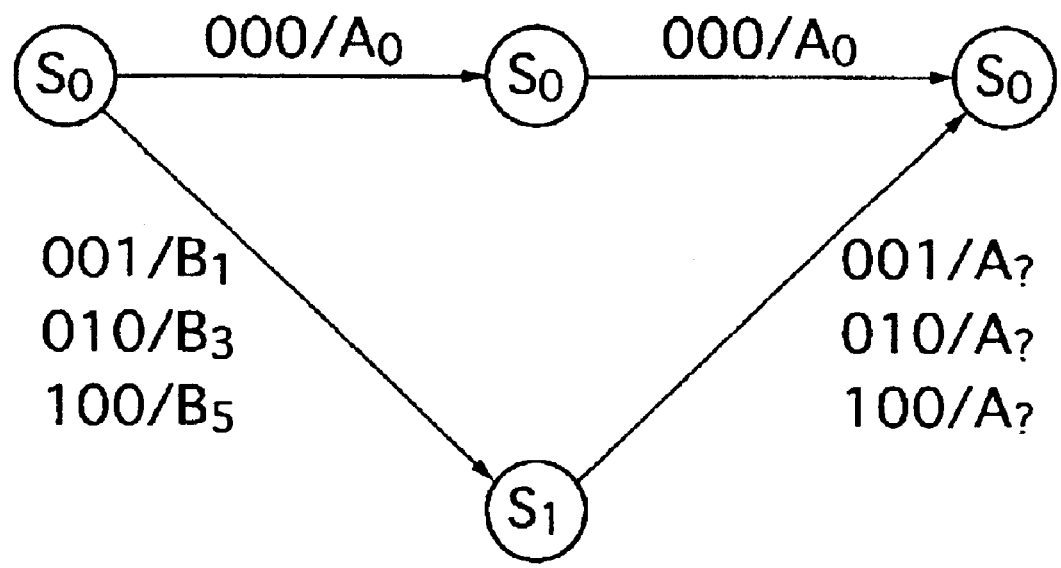
FIG. 24 shows part of the trellis shown in FIG. 22, illustrating paths with an input distance of two on the basis of the all-zero path.
Figure 25:
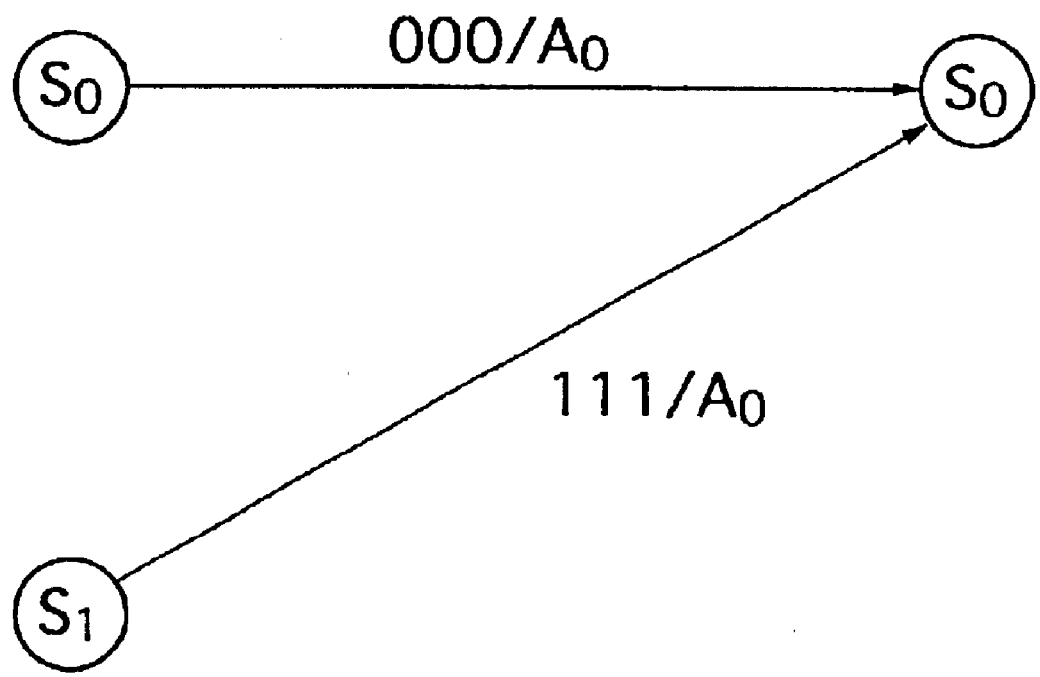
FIG. 25 shows part of the trellis shown in FIG. 22, illustrating the assignment of an input/output label having the element $A_0$ as its output to a path extending from state $S_1$ to state $S_0$ in accordance with an input/output label assigned to a path extending from state $S_0$ to state $S_0$.
Figure 26:
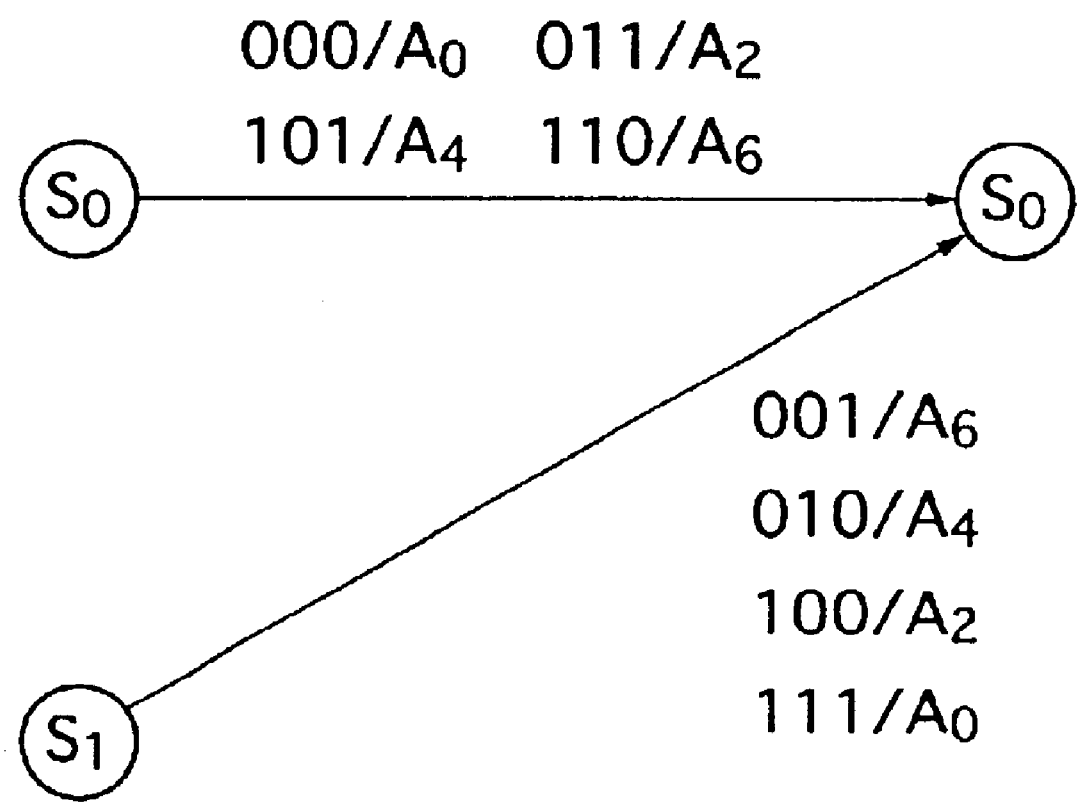
FIG. 26 shows part of the trellis shown in FIG. 22, illustrating the assignment of input/output labels to four paths extending from state $S_1$ to state $S_0$ in accordance with input/output labels assigned to paths extending from state $S_0$ to state $S_0$.
Figure 27:
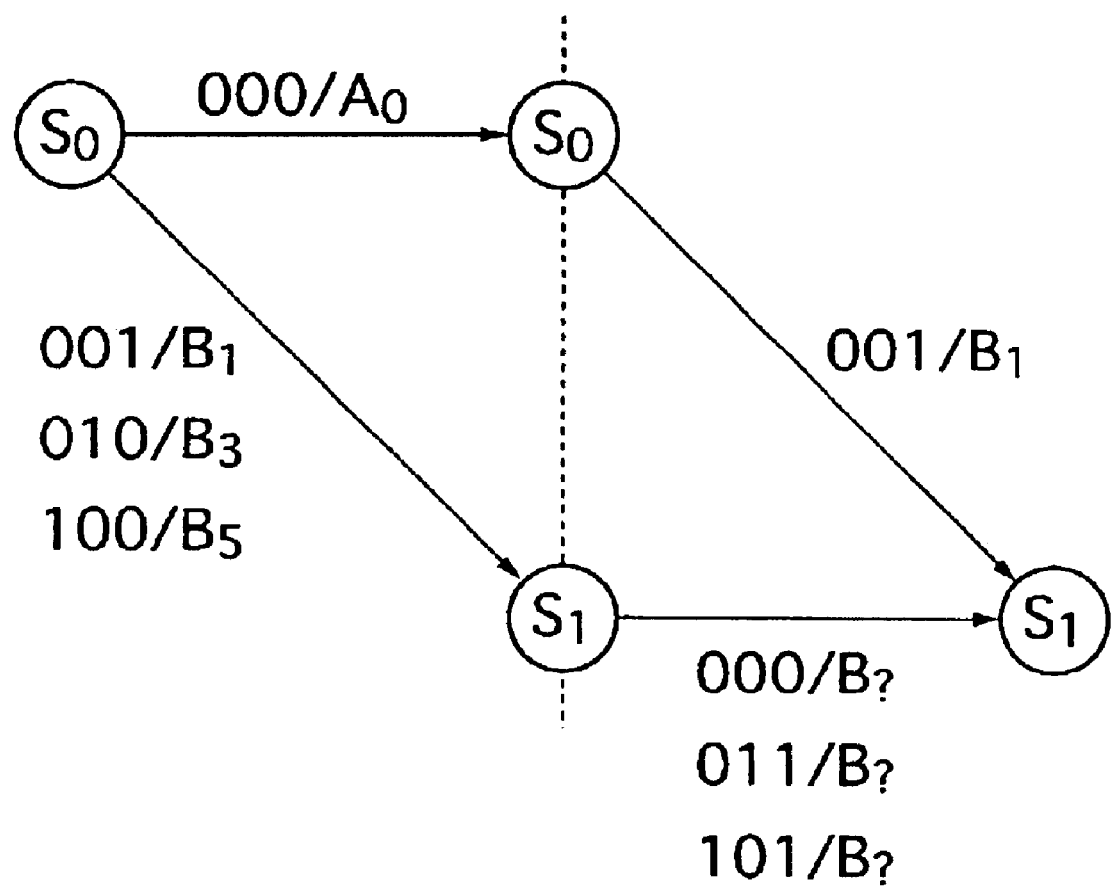
FIG. 27 shows part of the trellis shown in FIG. 22, illustrating the assignment of input/output labels to four paths extending from state $S_1$ to state $S_1$.
Figure 28:
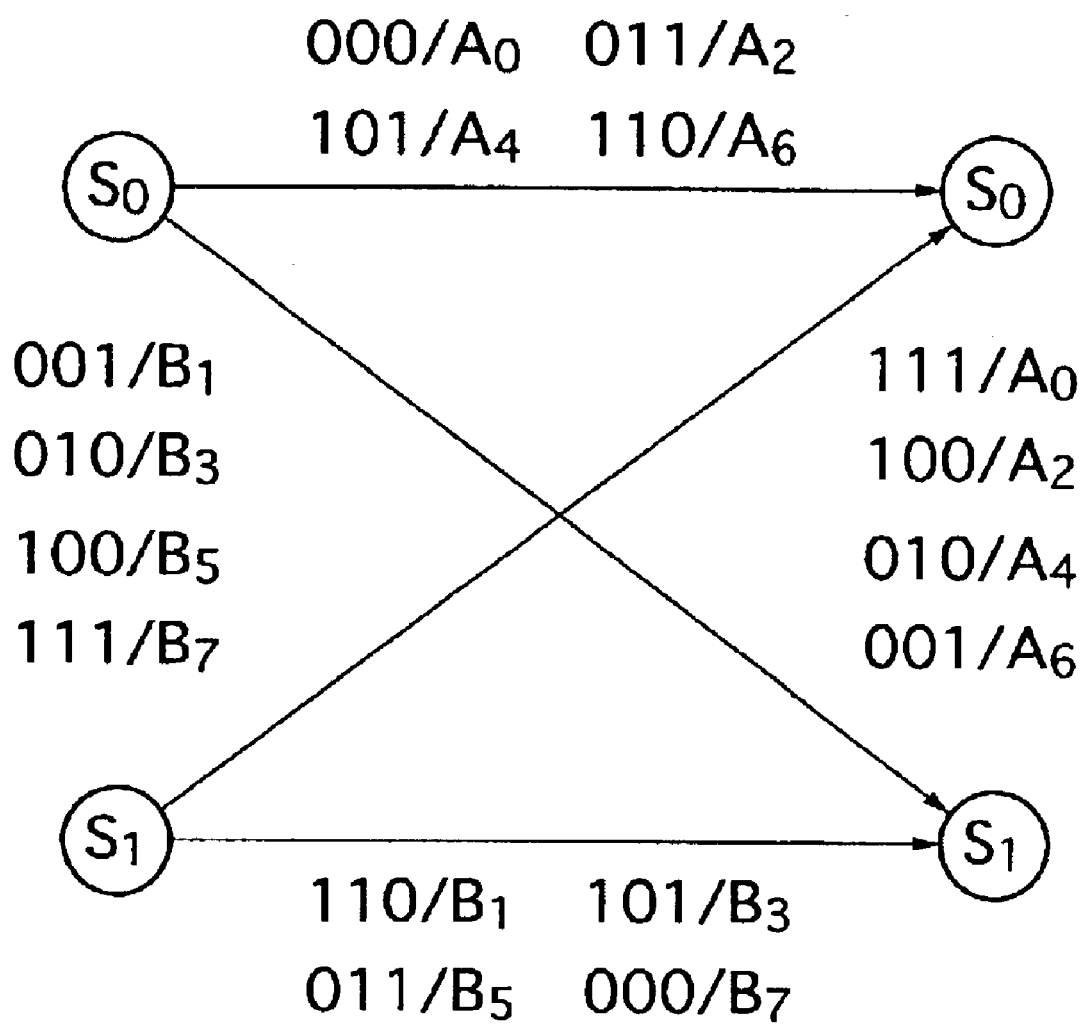
FIG. 28 is a diagram showing the entire trellis corresponding to the signal constellation shown in FIG. 19.
Figure 29:
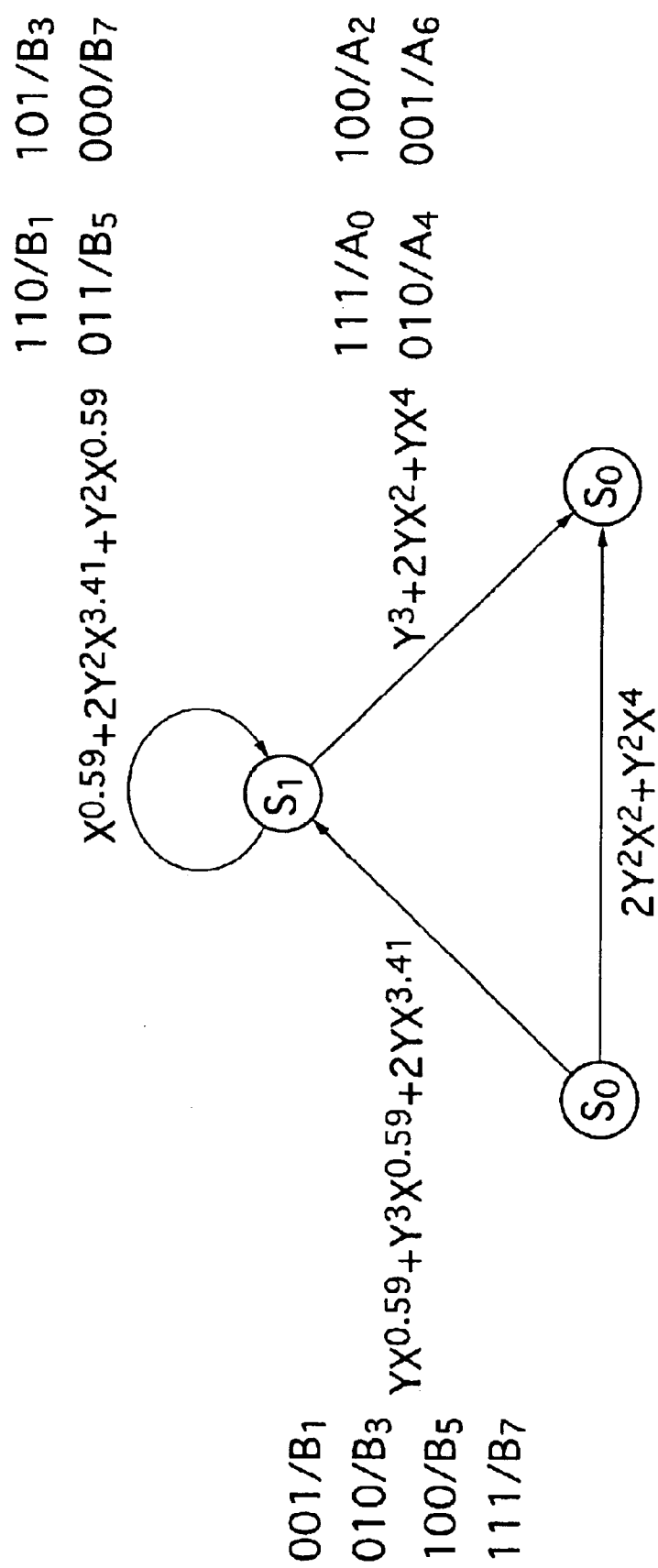
FIG. 29 a state transition diagram, which shows part of the trellis shown in FIG. 20, on the basis of the all-zero path.
Figure 30:
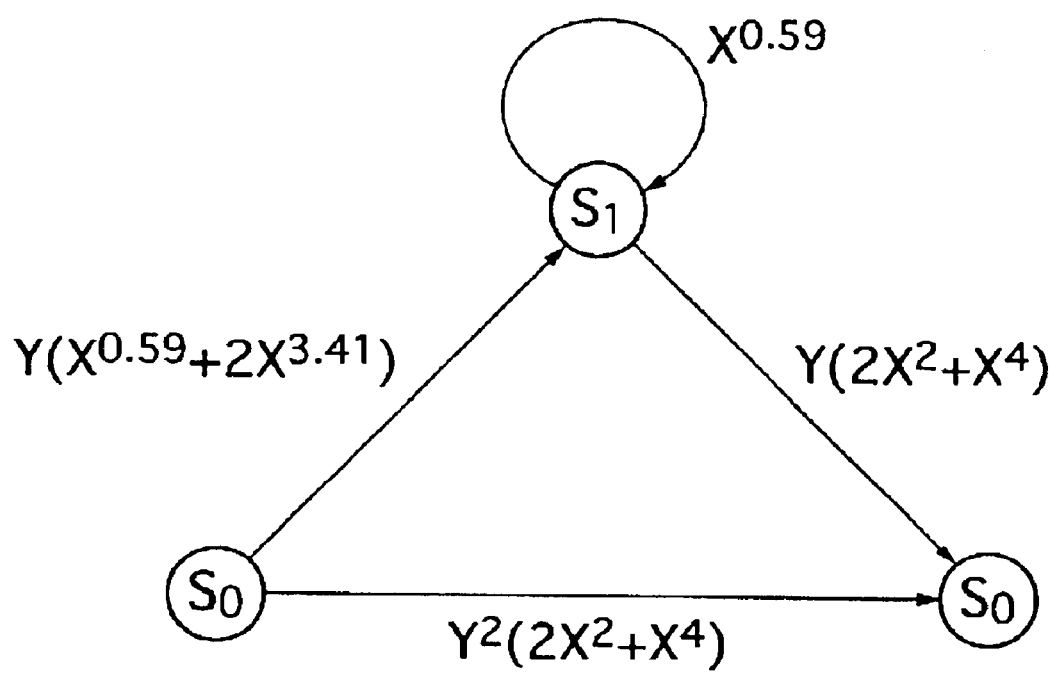
FIG. 30 is a state transition diagram, which is part of the state transition diagram shown in FIG. 29, illustrating paths having an input distance of two.
Figure 31:
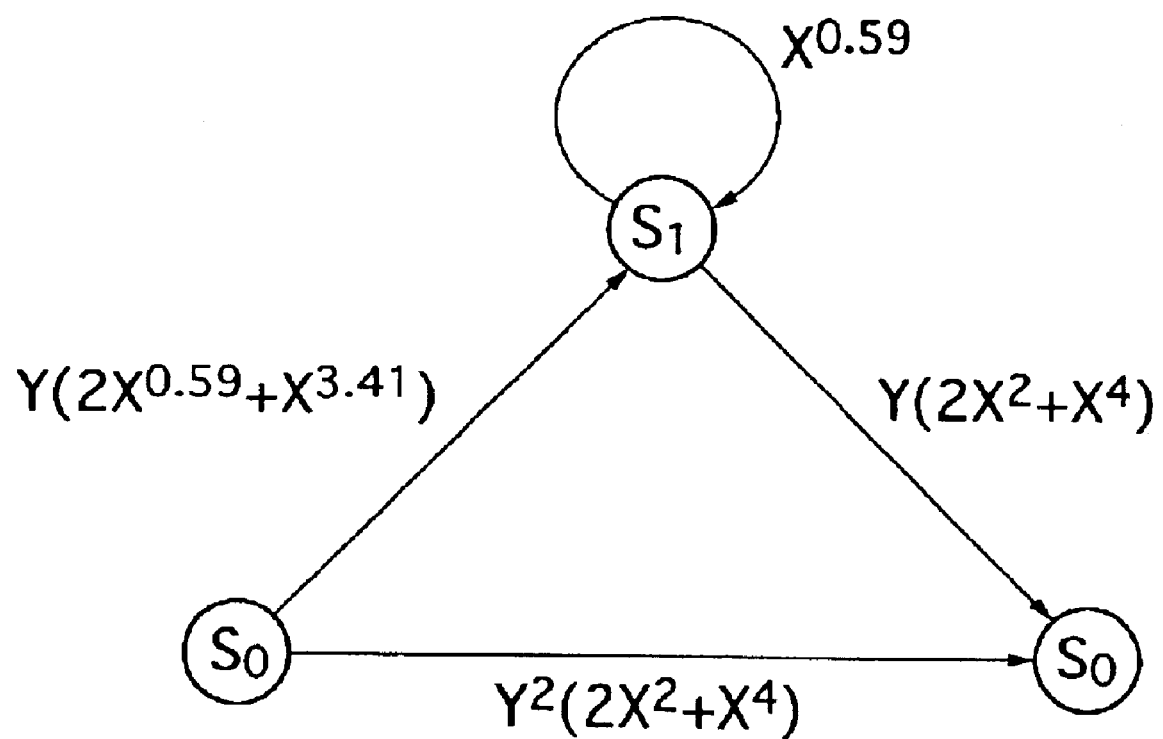
FIG. 31 is a state transition diagram, which is part of the state transition diagram shown in FIG. 29, illustrating paths having an input distance of two on the basis of $A_2$-$A_2$.

Referring to FIG. 12, a computer device 150 includes a CPU (central processing unit) 151 that controls the overall components, a ROM 152 for storing information including various programs, a RAM (random access memory) 153 functioning as a work area, an HDD (hard disk drive) 154 for reading and/or writing various programs and data, a bus 155 for interconnecting the CPU 151, ROM 152, RAM 153, and HDD 154, an input/output interface 156 for exchanging data between the CPU 151, ROM 152, RAM 153, and HDD 154 and a display unit 157, input unit 158, communication unit 159, and drive 160 (described hereinafter), the display unit 157 for displaying various types of information, the input unit 158 for receiving operations by the user, the communication unit 159 for communicating with the outside, and the drive 160 for reading and/or writing various types of information from/to a removable recording medium 170.

The CPU 151 is connected to the ROM 152, RAM 153, and HDD 154 via the bus 155 and controls the ROM 152, RAM 153, and HDD 154. Also, the CPU 151 is connected to the input/output interface 156 via the bus 155 and controls the display unit 157, input unit 158, communication unit 159, and drive 160 that are connected to the input/output interface 156. Also, the CPU 151 executes various programs recorded in the HDD 154 or the recording medium 170 placed on the drive 160.

The ROM 152 stores information including various programs. The information stored in the ROM 152 is read under the control of the CPU 151.

The RAM 153 functions as a work area for the CPU 151 to execute various programs. Under the control of the CPU 151, the RAM 153 temporarily stores various types of data.

The HDD 154 reads and/or writes various programs and data from/to a hard disk under the control of the CPU 151.

Under the control of the CPU 151, the bus 155 transmits various types of data read from the ROM 152, RAM 153, and HDD 154 and transmits various types of data to be written in the RAM 153 and HDD 154.

The input/output interface 156 includes an interface for displaying, under the control of the CPU 151, various types of information on the display unit 157, an interface for transmitting to the CPU 151 a control signal indicating the contents of an operation performed by the user using the input unit 158, an interface for exchanging data with the outside via the communication unit 159 under the control of the CPU 151, and an interface for reading and/or writing various types of information from/to the recording medium 170 mounted on the drive 160. The input/output interface 156 outputs data from the CPU 151, ROM 152, RAM 153, and HDD 154 to the display unit 157, input unit 158, communication unit 159, and drive 160 and inputs data from the display unit 157, input unit 158, communication unit 159, and drive 160 to the CPU 151, ROM 152, RAM 153, and HDD 154.

The display unit 157 includes, for example, an LCD (liquid crystal display). Under the control of the CPU 151, the display unit 157 displays various types of information including, for example, data recorded in the HDD 154.

The input unit 158 receives, for example, operations performed by the user using a keyboard or a mouse and outputs a control signal indicating the contents of the operations to the CPU 151.

The communication unit 159 functions as an interface for communicating with the outside using, for example, a network channel or a satellite link under the control of the CPU 151.

On the drive 160, the recording medium 170 such as a magnetic, optical, or magneto-optical disk, e.g., a floppy (registered trademark) disk, CD-ROM, or MO disk. Under the control of the CPU 151, the drive 160 reads and/or writes various types of information from/to the placed recording medium 170.

The computer device 150 described above executes a predetermined program using the CPU 151 to implement the coding processing by the above-described encoding device 1 and/or the decoding processing by the decoding device 3.

The coding processing by the computer device 150 will now be described.

When, for example, the user performs a predetermined operation to execute a coding program, the computer device 150 uses the input unit 158 to supply a control signal indicating the contents of the operation to the CPU 151. In response, the computer device 150 uses the CPU 151 to load the coding program into the RAM 153, executes the coding program, outputs an encoded transmission symbol generated by the encoding to the outside via the communication unit 159, and, if necessary, displays the processing result on the display unit 157.

The coding program is provided by, for example, the recording medium 170. Under the control of the CPU 151, the coding program may be directly read from the recording medium 170 or from the hard disk that has once recorded therein the coding program. Alternatively, the coding program may be stored in advance in the ROM 152. Data to be encoded is assumed to be recorded on the hard disk and corresponds to the above-described input data D1.

Specifically, when the computer device 150 executes the coding program by the CPU 151, under the control of the CPU 151, the computer device 150 reads desired data recorded on the hard disk, performs a convolutional operation to encode the outer code with a code rate of 2/3 and generates encoded data corresponding to the above-described encoded data D2. At this time, when the condition proposed as the above-described first guiding principle is applied, the computer device 150 generates, as the outer code, a code with the minimum output distance greater than the maximum input distance at which the minimum-distance inner code is generated.

Subsequently, under the control of the CPU 151, the computer device 150 interleaves the generated encoded data and generates interleaved data corresponding to the above-described interleaved data D3.

Subsequently, under the control of the CPU 151, the computer device 150 performs a convolutional operation to encode the inner code with a code rate of 3/3=1 and generates encoded data corresponding to the above-described encoded data D4. At this time, when the condition proposed as the above-described second guiding principle is applied, the computer device 150 generates, as the inner code, a code that is not terminated with an odd-numbered input distance.

Under the control of the CPU 151, the computer device 150 maps the generated encoded data to, for example, an 8PSK transmission symbol and generates an encoded transmission symbol corresponding to the above-described encoded transmission symbol D5.

Under the control of the CPU 151, the computer device 150 writes once the generated encoded transmission symbol in the hard disk or the like. Subsequently, at a desired time, the computer device 150 reads the encoded transmission symbol, outputs the read encoded transmission symbol via the communication unit 159, and, if necessary, displays the processing result or the like on the display unit 157. The generated encoded transmission symbol may be recorded in the recording medium 170.

As discussed above, the computer device 150 implements the coding processing by the above-described encoding device 1 by executing the coding program.

The decoding processing by the computer device 150 will now be described.

When, for example, the user performs a predetermined operation to execute a decoding program, the computer device 150 uses the input unit 158 to supply a control signal indicating the contents of the operation to the CPU 151. In response, the computer device 150 uses the CPU 151 to load the decoding program into the RAM 153, executes the decoding program, decodes a received value that is received from the outside via the communication unit 159 and recorded in the hard disk or the like and that corresponds to the above-described received value D6, and, if necessary, displays the processing result on the display unit 157.

As in the case with the coding program, the decoding program is provided by, for example, the recording medium 170. Under the control of the CPU 151, the decoding program may be directly read from the recording medium 170 or from the hard disk that has once recorded therein the decoding program. Alternatively, the decoding program may be stored in advance in the ROM 152.

Specifically, when the computer device 150 executes the decoding program by the CPU 151, under the control of the CPU 151, the computer device 150 performs, for example, MAP decoding, based on the BCJR algorithm, Max-Log-BCJR algorithm, or Log-BCJR algorithm, of the received value read from the hard disk or the received value received via the communication unit 159. Accordingly, the computer device 150 performs soft-output decoding of the inner code and generates extrinsic information corresponding to the above-described extrinsic information D8.

Subsequently, under the control of the CPU 151, the computer device 150 de-interleaves the generated extrinsic information and generates a-priori probability information corresponding to the above-described a-priori probability information D9.

Subsequently, under the control of the CPU 151, the computer device 150 performs, for example, MAP decoding of the generated a-priori probability information based on the BCJR algorithm, Max-Log-BCJR algorithm, or Log-BCJR algorithm. Accordingly, the computer device 150 performs soft-output decoding of the outer code and generates extrinsic information corresponding to the above-described extrinsic information D12. The computer device 150 interleaves the extrinsic information and generates a-priori probability information corresponding to the above-described a-priori probability information D7.

Under the control of the CPU 151, the computer device 150 iterates the decoding processing a predetermined number of times, such as a few times to several dozen times, and outputs hard-output decoded data on the basis of hard-output a-posteriori probability information that corresponds to the above-described a-posteriori probability information D15 and that is obtained as a result of the decoding operation performed the predetermined number of times.

Under the control of the CPU 151, the computer device 150 writes the obtained decoded data in the hard disk or the like and, if necessary, displays the processing result on the display unit 157. The obtained decoded data may be recorded in the recording medium 170.

As discussed above, the computer device 150 implements the decoding processing by the above-described decoding device 3 by executing the decoding program.

It is to be understood that modifications can be made without departing from the scope of the present invention.

What is claimed is:

1. An encoding device that performs serially concatenated convolutional coding or serial concatenated trellis coded modulation of input data, comprising:
   first component encoding means for performing predetermined encoding of the input data;
   interleaving means for permuting first encoded data generated by the encoding by the first component encoding means; and
   second component encoding means for performing predetermined encoding of interleaved data generated by the interleaving means to generate second encoded data, the second component encoding means being serially concatenated with the interleaving means,
   wherein the second component encoding means includes two or more storage elements for storing data, and
   wherein the first encoded data generated by the first component encoding means has a minimum output distance greater than the maximum input distance at which a minimum-distance code is generated by the second component encoding means.

2. An encoding device according to claim 1, wherein the second component encoding means uses a generator matrix having a feedback polynomial expressed as a primitive polynomial.

3. An encoding device according to claim 1, wherein the first component encoding means and the second component encoding means each perform convolutional coding.

4. An encoding device according to claim 1, further comprising mapping means for mapping the second encoded data generated by the encoding by the second component encoding means to a transmission symbol in a predetermined modulation system.

5. An encoding device according to claim 4, wherein the mapping means performs eight-phase shift keying.

6. An encoding method for performing serially concatenated convolutional coding or serial concatenated trellis coded modulation of input data, comprising:
   a first component encoding step of performing predetermined encoding of the input data;
   an interleaving step of permuting first encoded data generated by the encoding in the first component encoding step; and
   a second component encoding step of performing predetermined encoding of interleaved data generated in the interleaving step to generate second encoded data,
   wherein, in the second component encoding step, the encoding is performed using two or more storage elements for storing data, and
   wherein the first encoded data generated in the first component encoding step has a minimum output distance greater than the maximum input distance at which a minimum-distance code is generated in the second component encoding step.

7. An encoding method according to claim 6, wherein, in the second component encoding step, the encoding is performed using a generator matrix having a feedback polynomial expressed as a primitive polynomial.

8. An encoding method according to claim 6, wherein, in the first component encoding step and the second component encoding step, convolutional coding is performed.

9. An encoding method according to claim 6, further comprising a mapping step of mapping the second encoded data generated by the encoding in the second component encoding step to a transmission symbol in a predetermined modulation system.

10. An encoding method according to claim 9, wherein, in the mapping step, eight-phase shift keying is performed.

11. A decoding device that decodes a code generated by serially concatenated convolutional coding or serial concatenated trellis coded modulation by an encoding device including first component encoding means for performing predetermined encoding of input data; first interleaving means for permuting first encoded data generated by the encoding by the first component encoding means; and second component encoding means for performing predetermined encoding of interleaved data generated by the first interleaving means to generate second encoded data, the second component encoding means being serially concatenated with the first interleaving means, wherein the second component encoding means includes two or more storage elements for storing data, and wherein the first encoded data generated by the first component encoding means has a minimum output distance greater than the maximum input distance at which a minimum-distance code is generated by the second component encoding means, the decoding device comprising:
   first soft-output decoding means for receiving a soft-input received value and a-priori probability information corresponding to information bits, performing soft-output decoding, and generating first extrinsic information at each time, the first soft-output decoding means being associated with the second component encoding means;
   de-interleaving means for permuting the soft-input first extrinsic information generated by the first soft-output decoding means so that the order of the interleaved data permuted by the first interleaving means is rearranged to the order of the first encoded data generated by the encoding by the first component encoding means, the de-interleaving means being serially concatenated with the first soft-output decoding means;
   second soft-output decoding means for performing soft-output decoding using soft-input a-priori probability information that is generated by the de-interleaving means and that corresponds to encoded bits and soft-input a-priori probability information corresponding to the information bits and generating a-posteriori probability information and/or second extrinsic information corresponding to the information bits at each time, the second soft-output decoding means being associated with the first component encoding means and being serially concatenated with the de-interleaving means; and second interleaving means for permuting, on the basis of the same rearrangement position information as that of the first interleaving means, the soft-input second extrinsic information generated by the second soft-output decoding means, wherein the first soft-output decoding means receives, as the a-priori probability information corresponding to the information bits, the soft-input second extrinsic information generated by the second interleaving means.

12. A decoding device according to claim 11, further comprising binarization means for binarizing the soft-input a-posteriori probability information that is generated by the second soft-output decoding means and that corresponds to the information bits and outputting the binarized data as hard-output decoded data.

13. A decoding device according to claim 11, wherein the second component encoding means uses a generator matrix having a feedback polynomial expressed as a primitive polynomial.

14. A decoding device according to claim 11, wherein the first component encoding means and the second component encoding means each perform convolutional coding.

15. A decoding device according to claim 11, further comprising mapping means for mapping the second encoded data generated by the encoding by the second component encoding means to a transmission symbol in a predetermined modulation system.

16. A decoding device according to claim 15, wherein the mapping means performs eight-phase shift keying.

17. A decoding device according to claim 11, wherein the first soft-output decoding means and the second soft-output decoding means each perform maximum a-posteriori probability decoding based on a BCJR algorithm, Max-Log-BCJR algorithm, or Log-BCJR algorithm.

18. A decoding device according to claim 11, wherein the probability of passing through an arbitrary state is computed on the basis of the received value, and the code is iteratively decoded using the probability.

19. A decoding method for decoding a code generated by serially concatenated convolutional coding or serial concatenated trellis coded modulation by an encoding method including a first component encoding step of performing predetermined encoding of input data; an interleaving step of permuting first encoded data generated by the encoding in the first component encoding step; and a second component encoding step of performing predetermined encoding of interleaved data generated in the interleaving step to generate second encoded data, wherein, in the second component encoding step, the encoding is performed using two or more storage elements for storing data, and wherein the first encoded data generated in the first component encoding step has a minimum output distance greater than the maximum input distance at which a minimum-distance code is generated in the second component encoding step, the decoding method comprising:

a first soft-output decoding step of receiving a soft-input received value and a-priori probability information corresponding to information bits, performing soft-output decoding, and generating first extrinsic information at each time, the first soft-output decoding step being associated with the second component encoding step;

a de-interleaving step of permuting the soft-input first extrinsic information generated in the first soft-output decoding step so that the order of the interleaved data permuted in the first interleaving step is rearranged to the order of the first encoded data generated in the encoding in the first component encoding step;

a second soft-output decoding step of performing soft-output decoding using soft-input a-priori probability information that is generated in the de-interleaving step and that corresponds to encoded bits and soft-input a-priori probability information corresponding to the information bits and generating a-posteriori probability information and/or second extrinsic information corresponding to the information bits at each time, the second soft-output decoding step being associated with the first component encoding step; and a second interleaving step of permuting, on the basis of the same rearrangement position information as that of the first interleaving step, the soft-input second extrinsic information generated in the second soft-output decoding step, wherein, in the first soft-output decoding step, the soft-input second extrinsic information generated in the second interleaving step is received as the a-priori probability information corresponding to the information bits.

20. A decoding method according to claim 19, further comprising a binarization step of binarizing the soft-input a-posteriori probability information that is generated in the second soft-output decoding step and that corresponds to the information bits and outputting the binarized data as hard-output decoded data.

21. A decoding method according to claim 19, wherein, in the second component encoding step, the encoding is performed using a generator matrix having a feedback polynomial expressed as a primitive polynomial.

22. A decoding method according to claim 19, wherein, in the first component encoding step and the second component encoding step, convolutional coding is performed.

23. A decoding method according to claim 19, further comprising a mapping step of mapping the second encoded data generated by the encoding in the second component encoding step to a transmission symbol in a predetermined modulation system.

24. A decoding method according to claim 23, wherein in the mapping step, eight-phase shift keying is performed.

25. A decoding method according to claim 19, wherein, in the first soft-output decoding step and the second soft-output decoding step, maximum a-posteriori probability decoding based on a BCJR algorithm, Max-Log-BCJR algorithm, or Log-BCJR algorithm is performed.

26. A decoding method according to claim 19, wherein the probability of passing through an arbitrary state is computed on the basis of the received value, and the code is iteratively decoded using the probability.

27. An encoding device that performs serially concatenated convolutional coding or serial concatenated trellis coded modulation of input data, comprising:

first component encoding means for performing predetermined encoding of the input data;

interleaving means for permuting first encoded data generated by the encoding by the first component encoding means; and second component encoding means for performing predetermined encoding of interleaved data generated by the interleaving means to generate second encoded data, the second component encoding means being serially concatenated with the interleaving means, wherein the second component encoding means includes two or more storage elements for storing data, and the second encoded data generated thereby is not terminated with an odd-numbered input distance.

28. An encoding device according to claim 27, wherein the second component encoding means uses a generator matrix having a feedback polynomial expressed as $(1+D^n)$.

29. An encoding device according to claim 27, wherein the first component encoding means and the second component encoding means each perform convolutional coding.

30. An encoding device according to claim 27, further comprising mapping means for mapping the second encoded data generated by the encoding by the second component encoding means to a transmission symbol in a predetermined modulation system.

31. An encoding device according to claim 30, wherein the mapping means performs eight-phase shift keying.

32. An encoding method for performing serially concatenated convolutional coding or serial concatenated trellis coded modulation of input data, comprising:

a first component encoding step of performing predetermined encoding of the input data;

an interleaving step of permuting first encoded data generated by the encoding in the first component encoding step; and a second component encoding step of performing predetermined encoding of interleaved data generated in the interleaving step to generate second encoded data, wherein, in the second component encoding step, two or more storage elements for storing data are used, and the second encoded data generated thereby is not terminated with an odd-numbered input distance.

33. An encoding method according to claim 32, wherein, in the second component encoding step, the encoding is performed using a generator matrix having a feedback polynomial expressed as $(1+D^n)$.

34. An encoding method according to claim 32, wherein, in the first component encoding step and the second component encoding step, convolutional coding is performed.

35. An encoding method according to claim 32, further comprising a mapping step of mapping the second encoded data generated by the encoding in the second component encoding step to a transmission symbol in a predetermined modulation system.

36. An encoding method according to claim 35, wherein, in the mapping step, eight-phase shift keying is performed.

37. A decoding device that decodes a code generated by serially concatenated convolutional coding or serial concatenated trellis coded modulation by an encoding device including first component encoding means for performing predetermined encoding of input data; interleaving means for permuting first encoded data generated by the encoding by the first component encoding means; and second component encoding means for performing predetermined encoding of interleaved data generated by the interleaving means to generate second encoded data, the second component encoding means being serially concatenated with the interleaving means, wherein the second component encoding means includes two or more storage elements for storing data, and the second encoded data generated thereby is not terminated with an odd-numbered input distance, the decoding device comprising:

first soft-output decoding means for receiving a soft-input received value and a-priori probability information corresponding to information bits, performing soft-output decoding, and generating first extrinsic information at each time, the first soft-output decoding means being associated with the second component encoding means;

de-interleaving means for permuting the soft-input first extrinsic information generated by the first soft-output decoding means so that the order of the interleaved data permuted by the first interleaving means is rearranged to the order of the first encoded data generated by the encoding by the first component encoding means, the de-interleaving means being serially concatenated with the first soft-output decoding means;

second soft-output decoding means for performing soft-output decoding using soft-input a-priori probability information that is generated by the de-interleaving means and that corresponds to encoded bits and soft-input a-priori probability information corresponding to the information bits and generating a-posteriori probability information and/or second extrinsic information corresponding to the information bits at each time, the second soft-output decoding means being associated with the first component encoding means and being serially concatenated with the de-interleaving means; and second interleaving means for permuting, on the basis of the same rearrangement position information as that of the first interleaving means, the soft-input second extrinsic information generated by the second soft-output decoding means, wherein the first soft-output decoding means receives, as the a-priori probability information corresponding to the information bits, the soft-input second extrinsic information generated by the second interleaving means.

38. A decoding device according to claim 37, further comprising binarization means for binarizing the soft-input a-posteriori probability information that is generated by the second soft-output decoding means and that corresponds to the information bits and outputting the binarized data as hard-output decoded data.

39. A decoding device according to claim 37, wherein the second component encoding means uses a generator matrix having a feedback polynomial expressed as $(1+D^n)$.

40. A decoding device according to claim 37, wherein the first component encoding means and the second component encoding means each perform convolutional coding.

41. A decoding device according to claim 37, further comprising mapping means for mapping the second encoded data generated by the encoding by the second component encoding means to a transmission symbol in a predetermined modulation system.

42. A decoding device according to claim 41, wherein the mapping means performs eight-phase shift keying.

43. A decoding device according to claim 37, wherein the first soft-output decoding means and the second soft-output decoding means each perform maximum a-posteriori probability decoding based on a BCJR algorithm, Max-Log-BCJR algorithm, or Log-BCJR algorithm.

44. A decoding device according to claim 37, wherein the probability of passing through an arbitrary state is computed on the basis of the received value, and the code is iteratively decoded using the probability.

45. A decoding method for decoding a code generated by serially concatenated convolutional coding or serial concatenated trellis coded modulation by an encoding method including a first component encoding step of performing predetermined encoding of input data; an interleaving step of permuting first encoded data generated by the encoding in the first component encoding step; and a second component encoding step of performing predetermined encoding of interleaved data generated in the interleaving step to generate second encoded data, wherein, in the second component encoding step, two or more storage elements for storing data are used, and the second encoded data generated thereby is not terminated with an odd-numbered input distance, the decoding method comprising:

a first soft-output decoding step of receiving a soft-input received value and a-priori probability information corresponding to information bits, performing soft-output decoding, and generating first extrinsic information at each time, the first soft-output decoding step being associated with the second component encoding step;

a de-interleaving step of permuting the soft-input first extrinsic information generated in the first soft-output decoding step so that the order of the interleaved data permuted in the first interleaving step is rearranged to the order of the first encoded data generated by the encoding in the first component encoding step;

a second soft-output decoding step of performing soft-output decoding using soft-input a-priori probability information that is generated in the de-interleaving step and that corresponds to encoded bits and soft-input a-priori probability information corresponding to the information bits and generating a-posteriori probability information and/or second extrinsic information corresponding to the information bits at each time, the second soft-output decoding step being associated with the first component encoding step; and a second interleaving step of permuting, on the basis of the same rearrangement position information as that of the first interleaving step, the soft-input second extrinsic information generated in the second soft-output decoding step, wherein, in the first soft-output decoding step, the soft-input second extrinsic information generated in the second interleaving step is received as the a-priori probability information corresponding to the information bits.

46. A decoding method according to claim 45, further comprising a binarization step of binarizing the soft-input a-posteriori probability information that is generated in the second soft-output decoding step and that corresponds to the information bits and outputting the binarized data as hard-output decoded data.

47. A decoding method according to claim 45, wherein, in the second component encoding step, the encoding is performed using a generator matrix having a feedback polynomial expressed as $(1+D^n)$.

48. A decoding method according to claim 45, wherein, in the first component encoding step and the second component encoding step, convolutional coding is performed.

49. A decoding method according to claim 45, further comprising a mapping step of mapping the second encoded data generated by the encoding in the second component encoding step to a transmission symbol in a predetermined modulation system.

50. A decoding method according to claim 49, wherein, in the mapping step, eight-phase shift keying is performed.

51. A decoding method according to claim 45, wherein, in the first soft-output decoding step and the second soft-output decoding step, maximum a-posteriori probability decoding based on a BCJR algorithm, Max-Log-BCJR algorithm, or Log-BCJR algorithm is performed.

52. A decoding method according to claim 45, wherein the probability of passing through an arbitrary state is computed on the basis of the received value, and the code is iteratively decoded using the probability.

* * * * *